US005793113A

United States Patent [19]
Oda

[11] Patent Number: 5,793,113
[45] Date of Patent: Aug. 11, 1998

[54] MULTILEVEL INTERCONNECTION STRUCTURE FOR SEMICONDUCTOR DEVICES

[75] Inventor: Noriaki Oda, Tokyo, Japan

[73] Assignee: NEC Corporation, Tokyo, Japan

[21] Appl. No.: 591,301

[22] Filed: Jan. 25, 1996

[30] Foreign Application Priority Data

Jan. 25, 1995 [JP] Japan .................................. 7-009828

[51] Int. Cl.$^6$ .......................... H01L 23/48; H01L 23/52; H01L 29/40
[52] U.S. Cl. .......................... 257/774; 257/758; 257/763; 257/765; 257/767
[58] Field of Search .......................... 257/758, 763, 257/517, 774

[56] References Cited

U.S. PATENT DOCUMENTS

| | | | |
|---|---|---|---|
| 5,281,850 | 1/1994 | Kanamori | 257/767 |
| 5,416,359 | 5/1995 | Oda | 257/767 |

FOREIGN PATENT DOCUMENTS

| | | | |
|---|---|---|---|
| 377245 | 7/1990 | European Pat. Off. | 257/767 |
| 3250627 | 11/1991 | Japan | 257/767 |
| 3296219 | 12/1991 | Japan | 257/767 |

OTHER PUBLICATIONS

H. Rathore et al., "Electromigration and Current–Carrying Implications for Aluminum–Based Metallurgy with Tungsten Stud–Via Interconnections", Sibmicrometer Metallization, 1992, vol. 1805, pp. 251–262, No Month.

*Primary Examiner*—Stephen Meier
*Assistant Examiner*—T. M. Arroyo
*Attorney, Agent, or Firm*—Young & Thompson

[57] ABSTRACT

The present invention provides a novel interconnection structure which comprises an insulation layer having a contact hole which extends in a first vertical direction, a contact layer residing within the contact hole and being made of a first conductive material which has a first electromigration resistance, and an interconnection layer extending within the insulation layer. The interconnection layer has one end portion which is in contact with one end of the contact layer. The interconnection layer is made of a second conductive material having a second electromigration resistance which is smaller than the first electromigration resistance. The interconnection layer has a reservoir portion which is made of the second conductive material. The reservoir portion extends within the insulation layer and extends from the one end portion of the interconnection layer in a second vertical direction which is opposite to the first vertical direction.

120 Claims, 12 Drawing Sheets

MULTILEVEL INTERCONNECTION STRUCTURE FOR SEMICONDUCTOR DEVICES

BACKGROUND OF THE INVENTION

The present invention relates to a multilevel interconnection structure for a semiconductor device and a method for forming the same.

One of the typical multilevel interconnections is illustrated in FIG. 1. Field oxide layers 2 are selectively formed on a top surface of a silicon substrate 1 to define an active region of the substrate. A first inter-layer insulator 3 with a first contact hole is formed on tie field oxide film 2 and the active region. A titanium film 5 is formed on the field oxide film 2 and on both a vertical side wall and a bottom of the first contact hole. A titanium nitride film 6 is formed on the titanium film 5. A tungsten plug is selectively provided within the first contact hole. An aluminum film 9 is formed on the titanium nitride film 6. A titanium nitride film 10 is formed on the aluminum film 9. A first interconnection layer 11 comprises the titanium film 5, the titanium nitride film 6, the aluminum film 9 and the titanium nitride film 10. A second inter-layer insulator 41 with a second contact hole over the first interconnection layer 11 is formed on the first interconnection layer 11 and on the first inter-layer insulator 3. A titanium film 15 is formed on the second inter-layer insulator 41 and on both a vertical side wall and a bottom of the second contact hole. A titanium nitride film 16 is formed on the titanium film 15. A tungsten plug 17 is selectively provided within the first contact hole. An aluminum film 18 is formed on the titanium nitride film 16. A titanium nitride film 19 is formed on the aluminum film 18. A second interconnection layer 20 comprises the titanium film 15, the titanium nitride film 16, the aluminum film 18 and the titanium nitride film 19. A third inter-layer insulator 42 is formed on the second interconnection layer 20 and on the second inter-layer insulator 41.

When electrical current flows through the aluminum interconnection, electromigration is likely to appear due to a small electromigration resistance of aluminum. Aluminum atoms are likely to migrate along current of electrons. Electromigration may cause disconnection of the interconnection. Refractory metals have relatively high electromigration resistance Refractory metal atoms decline to migrate, whilst aluminum atoms and non-refractory metal atoms incline to migrate. If electron current flows from the refractory metal region to aluminum region, then any void is likely to be formed in the aluminum region but in the vicinity of an interface to the refractory metal region. The formation of void may lead to disconnection of the interconnection.

As illustrated in FIG. 2, a pair of low level interconnections 11 and 11a are arranged at a pitch P which is relatively large, for example, 1.6 micrometers. Another pair of high level interconnections 20 and 20a are connected to the low level interconnections via tungsten plugs within contact holes. When currents of electrons flow through the interconnections, tungsten atoms decline to migrate whilst aluminum atoms incline to migrate. For this reason, a hillock 44 and a void 43 are likely to be formed as illustrated in FIG. 3. If the pitch P is large, it is possible to provide pedestals 46 from which aluminum atoms are supplied to the void. However, the pitch has to be small when a high density integration is required. In this case, it is difficult to provide any pedestals.

In the above circumstance, it had been required to develop quite novel multilevel interconnection structures free from any problems with void and hillock.

SUMMARY OF THE INVENTION

Accordingly, it is an object of the present invention to provide a novel interconnection structure for a semiconductor device, which is free from the problems as described above.

It is another object of the present invention to provide a novel method for forming an interconnection structure for a semiconductor device, which is free from the problems as described above.

The present invention provides a novel interconnection structure which comprises an insulation layer having a contact hole which extends in a first vertical direction, a contact layer residing within the contact hole and being made of a first conductive material which has a first electromigration resistance, and an interconnection layer extending within the insulation layer. The interconnection layer has one end portion which is in contact with one end of the contact layer. The interconnection layer is made of a second conductive material having a second electromigration resistance which is smaller than the first electromigration resistance. The interconnection layer has a reservoir portion which is made of the second conductive material. The reservoir portion extends within the insulation layers and extends from the one end portion of the interconnection insulator in a second vertical direction which is opposite to the first vertical direction.

The present invention also provides another interconnection structure which comprises an insulation layer having a contact hole which extends in a first vertical direction, a contact layer residing within the contact hole and being made of a first conductive material which has a first electromigration resistance, and an interconnection layer extending within the insulation layer. The interconnection layer has an intermediate portion which is in contact with one end of the contact layer so that an electron current is divided at the intermediate portion into two currents flowing on the interconnection layer in the opposite directions. The interconnection layer is made of a second conductive material having a second electromigration resistance which is smaller than the first electromigration resistance. The interconnection layer has a reservoir portion which is made of the second conductive material. The reservoir portion extends within the insulation layer and extends from the intermediate portion in a second vertical direction which is opposite to the first vertical direction.

The present invention also provides still another interconnection structure which comprises an insulation layer having a contact hole which extends in a first vertical direction, a contact layer residing within the contact hole, the contact layer being made of a conductive material, and an interconnection layer being made of the same conductive material as the contact layer. The interconnection layer extends within the insulation layer in a horizontal direction. The interconnection layer has one end portion which is in contact with one end of the contact layer so that an electron current flows on both the contact layer and the interconnection layer. The electron current has a passage which is turned at an almost right angle at a boundary between the contact layer and the interconnection layer. The electron current has a higher current density at the boundary than other portions of both the interconnection layer and the contact layer. The interconnection layer has a reservoir portion which is made of the same material as the interconnection layer. The reservoir portion extends within the insulation layer and extends from the end portion of the interconnection layer in a second vertical direction which is opposite to the first vertical direction.

The present invention provides a further interconnection structure which comprises an insulation layer having a contact hole which extends in a first vertical direction, a contact layer residing wit the contact bole and being made of a conductive material, and an interconnection layer being made of the same conductive material as the contact layer. The interconnection layer extends within the insulation layer in a horizontal direction. The interconnection layer has an intermediate portion which is in contact with one end of the contact layer so that an electron current flows on both the contact layer and the interconnection layer. The electron current on the interconnection layer comprises two currents flowing in the opposite directions. The electron current has a passage which is turned at an almost right angle at a boundary between the contact layer and the interconnection layer. The electron current also has a higher current density at the boundary than other portions of both the interconnection layer and the contact layer. The interconnection layer has a reservoir portion which is made of the same material as the interconnection layer. The reservoir portion extends within the insulation layer and extends from the intermediate portion in a second vertical direction which is opposite to the first vertical direction.

The present invention provides a still further interconnection structure which comprises an insulation layer having a contact hole which extends in a first vertical direction, a contact layer being provided within the contact hole to fill up the contact hole, and an interconnection layer. The contact layer further comprises first, second and third contact films. The first contact film both extends on a vertical inner wall of the contact hole and fills up one end of the contact hole. The first contact film is made of a first conductive material having a first electromigration resistance. The second contact film extends on the first contact film and is made of a second conductive material having a second electromigration resistance which is higher than the first electromigration resistance. The third contact film extends on the second contact film so that laminations of the first, second and third contact films fill up an entire part of the contact hole. The third contact film is made of a third conductive material having a third electromigration resistance which is substantially equal to or smaller than the second electromigration resistance. The interconnection layer extends within the insulation layer and has one end portion which is connected with the contact layer so that the interconnection layer is in contact with the first contact film. The interconnection layer is made of the first conductive material.

The present invention provides yet a further interconnection structure which comprises an insulation layer having a contact hole which extends in a first vertical direction, a contact layer being provided within the contact hole to fill up the contact hole, and an interconnection layer. The contact layer further comprises first, second and third contact films. The first contact film both extends on a vertical inner wall of the contact hole and fills up one end of the contact hole. The first contact film is made of a first conductive material having a first electromigration resistance. The second contact film extends on the first contact film. The second contact film is made of a second conductive material having a second electromigration resistance which is higher than the first electromigration resistance. The third contact film extends on the second contact film so that laminations of the first, second and third contact films fill up an entire part of the contact hole. The third contact film is made of a third conductive material having a third electromigration resistance which is substantially equal to or smaller than the second electromigration resistance. The interconnection layer extends within the insulation layer. The interconnection layer has an intermediate portion which is connected with the contact layer. The interconnection layer is in contact with the first contact film so that an electron current is divided at the intermediate portion into two currents flowing on the interconnection layer in the opposite directions. The interconnection layer is made of the first conductive material.

BRIEF DESCRIPTIONS OF THE DRAWINGS

Preferred embodiments of the present invention will be described in detail with reference to the accompanying drawings.

DISCLOSURE OF THE INVENTION

Figure 1:
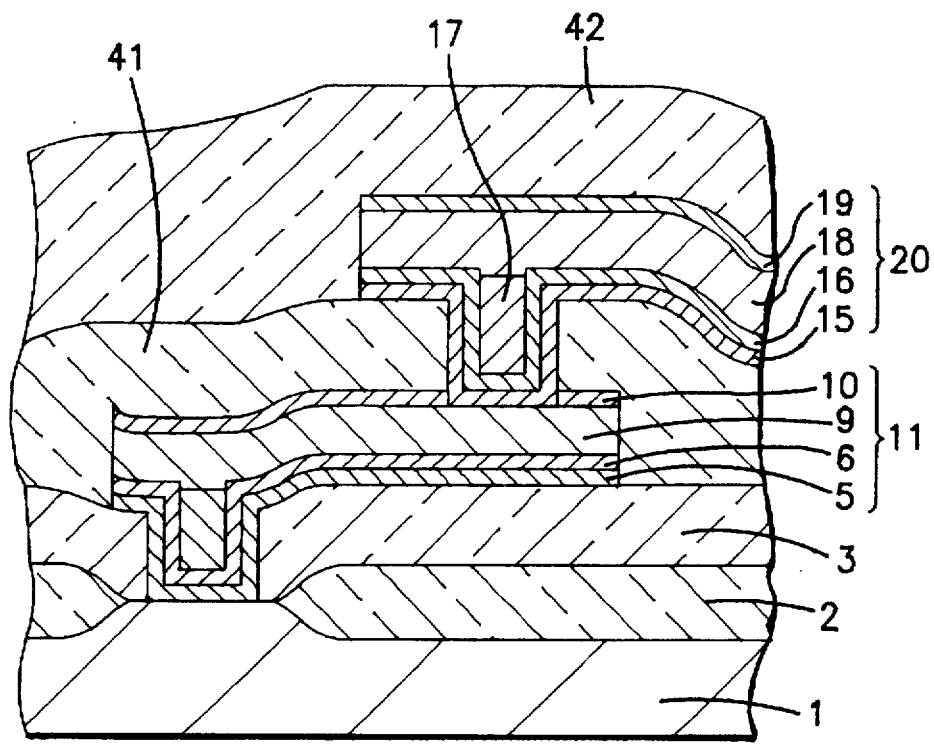
FIG. 1 is a fragmentary cross sectional elevation view illustrative of the conventional multilevel interconnection structure.
Figure 2:
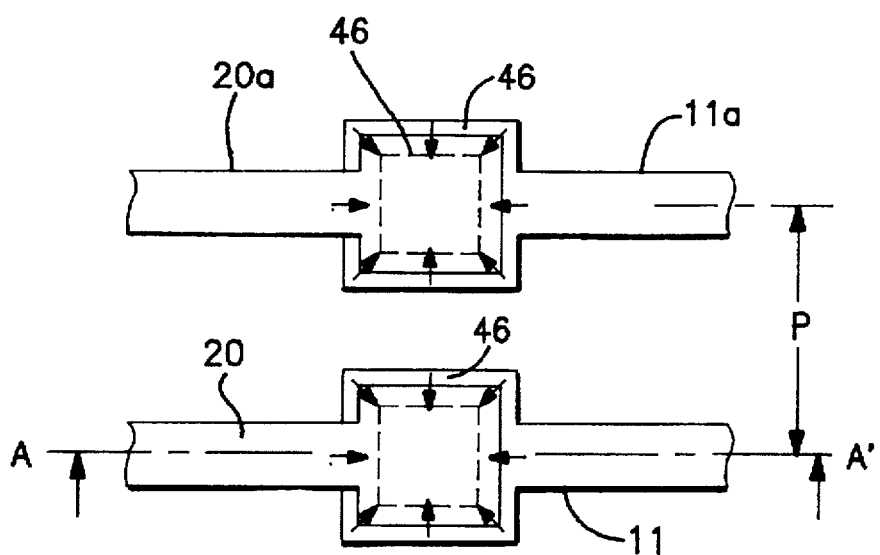
FIG. 2 is a fragmentary plane view illustrative of contact holes and interconnection layers in the prior art.
Figure 3:
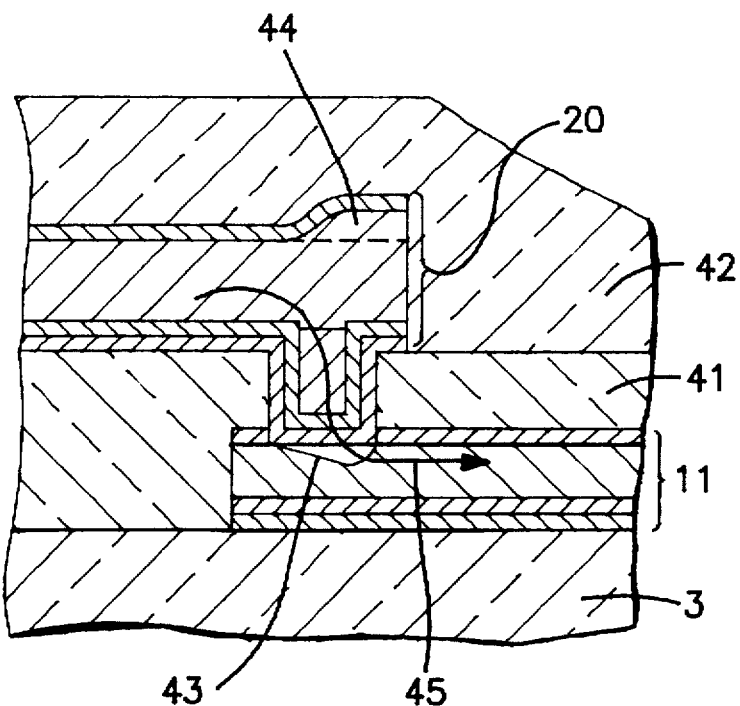
FIG. 3 is a fragmentary cross sectional elevation view illustrative of the conventional multilevel interconnection layers having a large void and a hillock, both of which are formed by electromigration.

The present invention provides a novel interconnection structure which comprises an insulation layer having a contact hole which extends in a first vertical direction, a contact layer residing within the contact hole and being made of a first conductive material which has a first electromigration resistance, and an interconnection layer extending within the insulation layer. The interconnection layer has one end portion which is in contact with one end of the contact layer. The interconnection layer is made of a second conductive material having a second electromigration resistance which is smaller than the first electromigration resistance. The interconnection layer has a reservoir portion which is made of the second conductive material. The reservoir portion extends within the insulation layer and extends from the one end portion of the interconnection insulator in a second vertical direction which is opposite to the first vertical direction.

If the first vertical direction is upward, then the second vertical direction is downward. If the first vertical direction is downward, then the second vertical direction is upward.

It is available that the first conductive material is a refractory metal. In this case, the refractory metal may, for example, be either tungsten or titanium.

It is available that the first conductive material is titanium nitride.

Alternatively, it is available that the first conductive material is a refractory silicide.

It is available that the second conductive material is a non-refractory metal which is not classified into refractory metals. In this case, the non-refractory metal may, for example, be either Al, Cu or AlSiCu. In this case, it is optionally available to further provide a titanium nitride film which coats an entire surface of the interconnection layer except for the reservoir portion, provided that the insulation layer is made of silicon oxide, in order to physically isolate the non-refractory metal from the insulation layer made of silicon oxide. In this case, it is optionally available to furthermore provide a titanium film which is interposed between the titanium nitride film and the insulation layer made of silicon oxide.

It is available that the interconnection layer extends in a horizontal direction so that the interconnection layer and the contact layer are connected with each other at a right angle.

It is available that the contact layer may optionally comprise a titanium film extending at least on a vertical inner wall of the contact hole, a titanium nitride film extending on the titanium film, and a tungsten film residing on the titanium nitride film so that laminations of the titanium film, the titanium nitride film and the tungsten film fill up an entire part of the contact hole. In this case, it is optionally available that the titanium film not only extends on the vertical inner wall of the contact hole but also fills up the one end of the contact hole.

It is available that the reservoir portion has a horizontal section area which is nearly equal to a vertical section area of the interconnection layer.

It is available that the reservoir portion has a vertical length which is substantially equal to or larger than a thickness of the interconnection layer.

It is available to further provide an additional interconnection layer extending within the insulation layer, wherein the additional interconnection layer has one end portion which is in contact with another end, which is opposite to the one end, of the contact layer, and wherein the additional interconnection layer is made of the second conductive material. In this case, it is optionally available that the additional interconnection layer has all additional reservoir portion which is made of the same material as the additional interconnection layer, wherein the additional reservoir portion extends within the insulation layer and further extends from the one end portion of the additional interconnection layer in the first vertical direction. In this case, it is further optionally available that the additional interconnection layer has substantially the same structure and the same section size as the interconnection layer. In this case, it is furthermore optionally available that the additional reservoir portion has substantially the same size as the reservoir portion.

The present invention also provides another interconnection structure which comprises an insulation layer having a contact hole which extends in a first vertical direction, a contact layer residing within the contact hole and being made of a first conductive material which has a first electromigration resistance, and an interconnection layer extending within the insulation layer. The interconnection layer has an intermediate portion which is in contact with one end of the contact layer so that an electron current is divided at the intermediate portion into two currents flowing on the interconnection layer in the opposite directions. The interconnection layer is made of a second conductive material having a second electromigration resistance which is smaller than the first electromigration resistance. The interconnection layer has a reservoir portion which is made of the second conductive material. The reservoir portion extends within the insulation layer and extends from the intermediate portion in a second vertical direction which is opposite to the first vertical direction.

If the first vertical direction is upward, then the second vertical direction is downward. If the first vertical direction is downward, then the second vertical direction is upward.

It is available that the first conductive material is a refractory metal. In this case, the refractory metal may, for example, be either tungsten or titanium.

It is available that the first conductive material is titanium nitride.

It is available that the first conductive material is a refractory silicide.

It is available that the second conductive material is a non-refractory metal which is not classified into refractory metals. In this case, the metal may, for example, be either Al, Cu or AlSiCu. In this case, it is available to further provide a titanium nitride film which coats an entire surface of the interconnection layer except for the reservoir portion, provided that the insulation layer is made of silicon oxide, in order to physically isolate the non-refractory metal from the insulation layer made of silicon oxide. It is available to further provide a titanium film which is interposed between the titanium nitride film and the insulation layer made of silicon oxide.

It is available that the interconnection layer extends in a horizontal direction so that the interconnection layer and the contact layer are connected with each other at a right angle.

It is available that the contact layer comprises a titanium film extending at least on a vertical inner wall of the contact hole, a titanium nitride film extending on the titanium film, and a tungsten film residing on the titanium nitride film so that laminations of the titanium film, the titanium nitride film and the tungsten film fill up an entire part of the contact hole. In this case, The titanium film not only extends on the vertical inner wall of the contact hole but also fills up the one end of the contact hole.

It is available that the reservoir portion has a horizontal section area which is nearly equal to a vertical section area of the interconnection layer.

It is available that the reservoir portion has a vertical length which is substantially equal to or larger than a thickness of the interconnection layer.

It is available to further provide an additional interconnection layer extending within the insulation layer, wherein the additional interconnection layer has an intermediate portion which is in contact with another end, which is opposite to the one end, of the contact layer and being made of the second conductive material. In this case, it is optionally available that the additional interconnection layer has an additional reservoir portion which is made of the same material as the additional interconnection layer, wherein the additional reservoir portion extends within the insulation layer and further extends from the intermediate portion of the additional interconnection layer in the first vertical direction. In this case, it is also optionally available that the additional interconnection layer has substantially the same structure and the same section size as the interconnection layer. In this case, it is also optionally available that the additional reservoir portion has substantially the same size as the reservoir portion.

The present invention also provides still another interconnection structure which comprises an insulation layer having a contact hole which extends in a first vertical direction, a contact layer residing within the contact hole, the contact layer being made of a conductive material, and an interconnection layer being made of the same conductive material as the contact layer. The interconnection layer extends within the insulation layer in a horizontal direction. The interconnection layer has one end portion which is in contact with one end of the contact layer so that an electron current flows on both the contact layer and the interconnection layer. The electron current has a passage which is turned at an almost right angle at a boundary between the contact layer and the interconnection layer. The electron current has a higher current density at the boundary then other portions of both the interconnection layer and the contact layer. The interconnection layer has a reservoir portion which is made of the same material as the interconnection layer. The reservoir portion extends within the insulation layer and extends from the end portion of the interconnection layer in a second vertical direction which is opposite to the first vertical direction.

If the first vertical direction is upward, then the second vertical direction is downward. If the first vertical direction is downward, then the second vertical direction is upward.

It is available that the conductive material is a non-refractory metal which is not classified into refractory metals. In this case, the non-refractory metal may, for example, be either Al, Cu or AlSiCu. In this case, it is available to further provide a titanium nitride film which coats an entire surface of the interconnection layer except for the reservoir portion, provided that the insulation layer is made of silicon oxide, in order to physically isolate the non-refractory metal from the insulation layer made of silicon oxide. It is available to further provide a titanium film which is interposed between the titanium nitride film and the insulation layer made of silicon oxide.

It is available that the contact layer comprises a titanium thin film extending at least on a vertical inner wall of the contact hole, a titanium nitride the film extending on the titanium film, and a non-refractory metal thick film being made of the same material as the interconnection layer. The non-refractory metal thick film resides on the titanium nitride film so that laminations of the titanium film, the titanium nitride film aid the non-refractory refractory metal thick film fill up an entire part of the contact hole. In this case, it is available that the titanium film not only extends on the vertical inner wall of the contact hole but also fills up the one end of the contact hole.

It is available that the contact layer comprises a refractory metal thin film being made of a refractory metal and extending at least on a vertical inner wall of the contact hole, and a non-refractory metal thick film being made of the same material as the interconnection layer and residing on the refractory metal thin film so that laminations of the refractory metal thin film and the non-refractory metal thick film fill up an entire part of the contact hole. In this case, the refractory metal may, for example, be either tungsten or titanium.

It is available that the contact layer comprises a refractory silicide thin film being made of a refractory suicide and extending at least on a vertical inner wall of the contact hole, and a non-refractory metal thick film being made of the same material as the interconnection layer and residing on the refractory thin film, so that laminations of the refractory silicide thin film and the non-refractory metal thick film fill up an entire part of the contact hole. In this case, the refractory silicide may, for example, be tungsten silicide or molybdenum silicide.

It is available that the contact hole has a section area which is sufficiently smaller than an section area of the interconnection layer for further raising the current density at the boundary between the contact layer and the interconnection layer.

It is available that the reservoir portion has a horizontal section area which is nearly equal to a vertical section area of the interconnection layer.

It is available that the reservoir portion has a vertical length which is substantially equal to or larger than a thickness of the interconnection layer.

It is available to further provide an additional interconnection layer extending within tie insulation layer, wherein the additional interconnection layer has one end portion which is in contact with another end, which is opposite to the one end, of the contact layer, and the additional interconnection layer is made of the conductive material. In this case, it is optionally available that the additional interconnection layer has an additional reservoir portion which is made of the same material as the additional interconnection layer. and also that the additional reservoir portion extends within the insulation layer and further extends from the one end portion of the additional interconnection layer in the first vertical direction. In this case, it is also optionally available that the additional interconnection layer has substantially the same structure and the same section size as the interconnection layer. In this case, it is moreover available that the additional reservoir portion has substantially the same size as the reservoir portion.

The present invention provides a filter interconnection structure which comprises an insulation layer having a contact hole which extends in a first vertical direction, a contact layer residing within the contact hole and being made of a conductive material, and an interconnection layer being made of the same conductive material as the contact layer. The interconnection layer extends within the insulation layer in a horizontal direction. The interconnection layer has an intermediate portion which is in contact with one end of the contact layer so that an electron current flows on both the contact layer and the interconnection layer. The electron current on the interconnection layer comprises two currents flowing in the opposite directions. The electron current has a passage which is turned at an almost right angle at a boundary between the contact layer and the interconnection layer. The electron current also has a higher current density at the boundary than other portions of both the interconnection layer and the contact layer. The interconnection layer has a reservoir portion which is made of the same material as the interconnection layer. The reservoir portion extends within the insulation layer and extends from the intermediate portion in a second vertical direction which is opposite to the first vertical direction.

If the first vertical direction is upward, then the second vertical direction is downward. If the first vertical direction is downward, then the second vertical direction is upward.

It is available that the conductive material is a non-refractory metal which is not classified into refractory metals. In this case, the non-refractory metal may, for example, be either Al, Cu and AlSiCu. In this case, it is available to further provide a titanium nitride film which coats an entire surface of the interconnection layer except for the reservoir portion, provided that the insulation layer is made of silicon oxide, in order to physically isolate the non-refractory metal from the insulation layer made of silicon oxide. In this case, it is available further provide a titanium film which is interposed between the titanium nitride film and the insulation layer made of silicon oxide.

It is available that the contact layer comprises a titanium thin film extending at least on a vertical inner wall of the contact hole, a titanium nitride thin film extending on the titanium film, and a non-refractory metal thick film being made of the same material as the interconnection layer and residing on the titanium nitride film, so that laminations of the titanium film, the titanium nitride film and the non-refractory metal thick film fill up an entire part of the contact hole. In this case, it is also available that the titanium film not only extends on the vertical inner wall of the contact hole built also fills up the one end of the contact hole.

It is available that the contact layer comprises a refractory metal thin film being made of a refractory metal and extending at least on a vertical inner wall of the contact hole, and a non-refractory metal thick film being made of the same material as the interconnection layer and residing on the refractory metal thin film, so that laminations of the refractory metal thin film and the non-refractory metal thick film fill up an entire part of the contact hole. In this case, the refractory metal may, for example, be either tungsten or titanium.

It is available that the contact layer comprises a refractory silicide thin film being made of a refractory silicide and extending at least on a vertical inner wall of the contact hole, and a non-refractory metal thick film being made of the same material as the interconnection layer and residing of the refractory thin film, so that laminations of the refractory silicide thin film and the non-refractory metal thick film fill up an entire part of the contact hole. In this case, the refractory silicide may, for example, be either tungsten silicide and molybdenum silicide.

It is available that the contact hole has a section area which is sufficiently smaller than an section area of the interconnection layer for further raising the current density at the boundary between the contact layer and the interconnection layer.

It is available that the reservoir portion has a horizontal section area which is nearly equal to a vertical section area of the interconnection layer.

It is available that the reservoir portion has a vertical length which is substantially equal to or larger than a thickness of the interconnection layer.

It is available to further provide an additional interconnection layer extending within the insulation layer and having an intermediate portion which is in contact with another end, which is opposite to the one end, of the contact layer, wherein the additional interconnection layer is made of the conductive material. In this case, it is optionally available that the additional interconnection layer has an additional reservoir portion which is made of the same material as the additional interconnection layer, and also that the additional reservoir portion extends within the insulation layer and further extends from the intermediate portion of the additional interconnection layer in the first vertical direction. In this case, it is available that the additional interconnection layer has substantially the same structure and the same section size as the interconnection layer. In this case, it is available that the additional reservoir portion has substantially the same size as the reservoir portion.

The present invention provides a still further interconnection structure which comprises an insulation layer having a contact hole which extends in a first vertical direction, a contact layer being provided within the contact hole to fill up the contact hole, and an interconnection layer. The contact layer further comprises first, second and third contact films. The first contact film both extends on a vertical inner wall of the contact hole and resides to fill up one end of the contact hole. The first contact film is made of a first conductive material having a first electromigration resistance. The second contact film extends on the first contact film and is made of a second conductive material having a second electromigration resistance which is higher than the first electromigration resistance. The third contact film extends on the second contact film so that laminations of the first, second and third contact films fill up an entire part of the contact hole. The third contact film is made of a third conductive material having a third electromigration resistance which is substantially equal to or smaller than the second electromigration resistance. The interconnection layer extends within the insulation layer and has one end portion which is connected with the contact layer so that the interconnection layer is in contact with the first contact film. The interconnection layer is made of the first conductive material.

If the first vertical direction is upward, then the second vertical direction is downward. If the first vertical direction is downward, then the second vertical direction is upward.

It is available that the first conductive material is a non-refractory metal which is not classified into refractory metals. In this case, the non-refractory metal may, for example, be Al, Cu and AlSiCu.

It is available that the second conductive material is a refractory metal.

It is available that the second conductive material is titanium nitride.

It is available that the second conductive film comprises laminations of a titanium film and a titanium nitride film.

It is available that the second conductive material is a refractory silicide.

It is available that the third conductive material is a refractory metal.

It is available that the third conductive material is the same as the first conductive material.

It is available that the interconnection layer has a reservoir portion which is made of the same material as the interconnection layer, and that the reservoir portion extends within the insulation layer and extends from the one end portion of the interconnection layer in a second vertical direction which is opposite to the first vertical direction. In this case, it is optionally available that the reservoir portion has a horizontal section area which is nearly equal to a vertical section area of the interconnection layer. In this case, it is also available that the reservoir portion has a vertical length which is substantially equal to or larger than a thickness of the interconnection layer.

It is also available to further provide a titanium nitride film which coats an entire surface of the interconnection layer, provided that the insulation layer is made of silicon oxide, in order to physically isolate the non-refractory metal from the insulation layer made of silicon oxide. In this case, it is available further provide a titanium film which is interposed between the titanium nitride film and the insulation layer made of silicon oxide.

It is available to flier provide an additional interconnection layer extending within the insulation layer, wherein the additional interconnection layer has one end portion which is in contact with another end, which is opposite to the one end, of the contact layer, and wherein the additional interconnection layer is made of the first conductive material. In this case, it is optionally available that the additional interconnection layer has an additional reservoir portion which is made of the same material as the additional interconnection layer, and also that the additional reservoir portion extends within the insulation layer and further extends from the one end portion of the additional interconnection layer in the first vertical direction. In this case, it is available that the additional interconnection layer has substantially the same structure and the same section size as the interconnection layer. In this case, it is further available that the additional reservoir portion has substantially the same size as the reservoir portion.

The present invention provides yet a further interconnection structure which comprises an insulation layer having a contact hole which extends in a first vertical direction, a contact layer being provided within the contact hole to fill up the contact hole, and an interconnection layer. The contact layer further comprises first, second and third contact films. The first contact film both extends on a vertical inner wall of the contact hole and fills up one end of the contact hole. The first contact film is made of a first conductive material having a first electromigration resistance. The second contact film extends on the first contact film. The second contact film is made of a second conductive material having a second electromigration resistance which is higher than the first electromigration resistance. The third contact film extends on the second contact film so that laminations of the first, second and third contact films fill up an entire part of the contact hole. The third contact film is made of a third conductive material having a third electromigration resistance which is substantially equal to or smaller than the second electromigration resistance. The interconnection layer extends within the insulation layer. The interconnection layer has an intermediate portion which is connected with the contact layers. The interconnection layer is in contact with the first contact film so that an electron current is divided at the intermediate portion into two currents flowing on the interconnection layer in the opposite directions. The interconnection layer is made of the first conductive material.

If the first vertical direction is upward, then the second vertical direction is downward. If the first vertical direction is downward, then the second vertical direction is upward. The first conductive material is a non-refractory metal which is not classified into refractory metals. In this case, the non-refractory metal may, for example, be either Al, Cu and AlSiCu.

It is available that the second conductive material is a refractory metal.

It is available that the second conductive material is titanium nitride.

It is also available that the second conductive film comprises laminations of a titanium film and a titanium nitride film.

It is further available that the second conductive material is a refractory silicide.

It is moreover available that the third conductive material is a refractory metal.

It is still further available that the third conductive material is the same as the first conductive material.

It is yet further available that the interconnection layer has a reservoir portion which is made of the same material as the interconnection layer, and also that the reservoir portion extends within the insulation layer and extends from the one end portion of the interconnection layer in a second vertical direction which is opposite to the first vertical direction. In this case, it is available that the reservoir portion has a horizontal section area which is nearly equal to a vertical section area of the interconnection layer. In this case, it is available that the reservoir portion has a vertical length which is substantially equal to or larger than a thickness of the interconnection layer.

It is available to further provide a titanium nitride film which coats an entire surface of the interconnection layer, provided that the insulation layer is made of silicon oxide, in order to physically isolate the non-refractory metal from the insulation layer made of silicon oxide. In this case, it is available to further provide a titanium film which is interposed between the titanium nitride film and the insulation layer made of silicon oxide.

It is further available to further provide an additional interconnection layer extending within the insulation layer, wherein the additional interconnection layer has one end portion which is in contact with another end, which is opposite to the one end, of the contact layer, and wherein the additional interconnection layer is made of the first conductive material. In this case, it is optionally available that the additional interconnection layer has an additional reservoir portion which is made of the same material as the additional interconnection layer, and also that the additional reservoir portion extends within the insulation layer and further extends from the one end portion of the additional interconnection layer in the first vertical direction in this case, it is also optionally available that the additional interconnection layer has substantially the same structure and the same section size as the interconnection layer. In this case, it is further optionally available that the additional reservoir portion has substantially the same size as the reservoir portion.

According to the present invention, the reservoir portion and the contact hole extend from the end portion of the interconnection layer in the upward and downward directions, namely the opposite directions. The reservoir portion has the same plane size as the interconnection layer. In the plane view, the reservoir portion is included in the interconnection layer without extending outside the interconnection This means that providing the reservoir results in no increase in the necessary area thereby allowing a high density integration. Further, the secondary reservoir the aluminum film is provided within the contact hole. This means that providing the secondary reservoir results in no increase in the necessary area thereby allowing a high density integration.

Both the reservoir and secondary reservoir supply aluminum atoms to the end portion of the aluminum film of the interconnection layer. When electron currents flow from the contact layer to the aluminum film of the interconnection layer, then any void is likely to be formed due to electromigration in the aluminum film near a boundary between the aluminum film and the tungsten plug or the titanium nitride film since aluminum has a smaller electromigration resistance than that or tungsten or titanium nitride. If, however, any void is about to be formed due to electromigration, then immediately aluminum atoms in the reservoir portion move or migrate toward the position at which a void is about to be formed. Whilst aluminum atoms migrate from the boundary region along the electron current, a sufficient amount of fresh aluminum atoms are supplied from the reservoir portion to the boundary portion, to the tungsten film, of the aluminum film. For this reason, almost no void is formed due to electromigration. Accordingly, providing the reservoir portion near the boundary between the aluminum film and the tungsten plug or titanium nitride can prevent any formation of void due to electromigration for the above reason. Further, the reservoir portion is provided so that no part of the reservoir portion extends outwardly from the interconnection layers in horizontal directions. Needless to say, this structural condition is very important for realizing a possible high density integration in the two dimensional direction of the semiconductor device including multilevel interconnections. Therefore, the reservoir portion within the secondary reservoir portion of the present invention provides two very important effects, or not only prevents any formation of void due to electromigration, but also allows a possible high density integration in the two dimensional direction.

EMBODIMENTS

A first embodiment according to the present invention will be described, with reference to FIGS. 4A through 4E, wherein a novel structure of multilevel interconnection layers extending within inter-layer insulators and being connected to each other through a contact layer. The novel multilevel interconnection layers are structurally and physically improved not only to allow a high density integration of the interconnection layers but also to prevent any void formation due to electromigration of aluminum atoms in the interconnection layers.

The structure of the novel multilevel interconnection layers will be described with reference to FIG. 4E. Field oxide films 2 are selectively formed on a top surface of a silicon substrate 1 so that a passive region is defined as a region on which the field oxide films are formed and an active region is defined as a region on which no field oxide film is formed. A first inter-layer insulator 3 extends both on the field oxide film 2 and the active region of the silicon substrate 1. A first contact hole is provided which vertically extends from the active region of the silicon substrate 1 to the top surface of the first inter-layer insulator 3. The first contact hole has the bottom portion and a side wall, both of which are covered by a titanium film. A titanium nitride film is provided which extends on the titanium film. A tungsten plug is provided on the titanium nitride film so that the first contact hole is filled up both with the laminations of the titanium film and the titanium nitride film and with the tungsten plug.

A silicon oxide film 12 is provided on the first inter-layer insulator 3. A silicon oxide film 14 is provided on the silicon oxide film 12 so that the silicon oxide films 12 and 14 constitute a second inter-layer insulator. A first interconnection layer almost horizontally extends on the first inter-layer insulator and within the silicon oxide film 12. The first interconnection layer comprises an aluminum film 9 coated by a titanium nitride film and by the laminations of the titanium film and the titanium nitride film. The first interconnection layer has a fist end portion which is in contact with the top portion of the first contact layer within the first contact hole. The first contact layer extends downward from the first end portion of the first interconnection layer. The first end portion of the first interconnection layer also has a first reservoir portion which extends therefrom upwardly. The first reservoir portion is made of aluminum and is which contact directly with the aluminum film of the first interconnection layer. The first reservoir portion has the top which reaches an interface between the silicon oxide film 12 and a silicon oxide film 14 extending on the silicon oxide film 12. The first reservoir portion and the first contact hole extend from the first end portion of the first interconnection layer in the upward and downward directions, namely the opposite directions. The first reservoir portion has the same plane size as the first interconnection layer. In the plane view, the first reservoir portion is included in the first interconnection layer without extending outside the first interconnection. This means that providing the reservoir results in no increase in the necessary area thereby allowing a high density integration. The first reservoir is to supply aluminum atoms to the first end portion of the aluminum film 9 of the first interconnection layer. When electron currents flow from the first contact layer to the aluminum film of the first interconnection layer, then any void is likely to be formed due to electromigration in the aluminum film near a boundary between the aluminum film and the tungsten plug since aluminum has a smaller electromigration resistance than that of tungsten. If, however, any void is about to be formed due to electromigration, then immediately aluminum atoms in the reservoir portion move toward the position at which a void is about to be formed. Whilst aluminum atoms migrate from the boundary region along the electron current, a sufficient amount of fresh aluminum atoms are supplied from the reservoir portion to the boundary portion, to the tungsten film, of the aluminum film. For this reason, almost no void is formed due to electromigration. Accordingly, providing the reservoir portion near the boundary between the aluminum film and the tungsten plug can prevent any formation of void due to electromigration for the above reason.

The first interconnection layer has a second end portion which is in contact with a second contact layer provided within a second contact hole. The second contact hole extends upward from the second end portion of the first interconnection layer. The second end portion of the first interconnection layer also has a second reservoir portion which extends therefrom downward. The second reservoir portion is made of aluminum and is which contact directly with the aluminum film of the first interconnection layer. The second reservoir portion and the second contact hole extend from the second end portion of the first interconnection layer in the downward and upward directions, namely the opposite directions. The second reservoir portion has the same plane size as the first interconnection layer. In the plane view, the second reservoir portion is included in the first interconnection layer without extending outside the first interconnection. This means that providing the reservoir results in no increase in the necessary area thereby allowing a high density integration. The second reservoir is to supply aluminum atoms to the second end portion of the aluminum film 9 of the first interconnection layer. When electron currents flow from the second contact layer to the aluminum film of the first interconnection layer, then any void is likely to be formed due to electromigration in the aluminum film near a boundary between the aluminum film and the tungsten plug since aluminum has a smaller electromigration resistance than that of titanium nitride film. If, however, any void is about to be formed due to electromigration, then immediately aluminum atoms in the reservoir portion move toward the position at which a void is about to be formed. Whilst aluminum atoms migrate from the boundary region along the electron current, a sufficient amount of fresh aluminum atoms are supplied from the reservoir portion to the boundary portion, to the titanium nitride film, of the aluminum film. For this reason, almost no void is formed due to electromigration. Accordingly, providing the reservoir portion near the boundary between the aluminum film and the titanium nitrides can prevent any formation of void due to electromigration for the above reason. A second interconnection layer extends on the silicon oxide film 14. The second interconnection layer has the same structure as the first interconnection layer. The first and second interconnection layers are connected to each other through the second contact layer. The second interconnection layer has a first end portion which is in contact with the top of the second contact layer. The first end portion of the second interconnection layer has a third reservoir portion 22 which is made of aluminum. The third reservoir portion 22 extends upward from the first end portion of the second interconnection layer 20. The third reservoir portion 22 and the second contact hole extend upward and downward from the first end portion of the second interconnection layer 20. The third reservoir portion has the same role as the first reservoir, for which reason the descriptions thereof will be omitted. The second interconnection layer 20 has the same structure and the first interconnection layer. For example, the second interconnection layer 20 comprises an aluminum film 18 coated both by a titanium nitride film 19 and by laminations of a titanium film 15 and a titanium nitride film 16. The second interconnection layer 20 extends within a silicon oxide film 21. A silicon oxide film 23 extends to cover the silicon oxide film 21 and the third reservoir.

As described above, the reservoir portion and the contact hole extend from the end portion of the interconnection layer in the upward and downward directions, namely the opposite directions. The reservoir portion has the same plane size as the interconnection layer. In the plane view, the reservoir portion is included in the interconnection layer without extending outside the interconnection. This means that providing the reservoir results in no increase in the necessary area thereby allowing a high density integration.

The reservoir supplies aluminum atoms to the end portion of the aluminum film of the interconnection layer. When electron currents flow from the contact layer to the aluminum film of the interconnection layer, then any void is likely to be formed due to electromigration in the aluminum film near a boundary between the aluminum film and the tungsten plug or the titanium nitride film since aluminum has a smaller electromigration resistance than that of tungsten or titanium nitride. If, however, any void is about to be formed due to electromigration, then immediately aluminum atoms in the reservoir portion move or migrate toward the position at which a void is about to be formed. Whilst aluminum atoms migrate from the boundary region along the electron current, a sufficient amount of fresh aluminum atoms ate supplied from the reservoir portion to the boundary portion, to the tungsten film, of the aluminum film. For this reason, almost no void is formed due to electromigration. Accordingly, providing the reservoir portion near the boundary between the aluminum film and the tungsten plug or titanium nitride can prevent any formation of void due to electromigration for the above reason. Further, the reservoir portion is provided so that no part of the reservoir portion extends outwardly from the interconnection layers in horizontal directions. Needless to say, this structural condition is very important for realizing a possible high density integration in the two dimensional direction of the semiconductor device including multilevel interconnections. Therefore, the reservoir portion of the present invention provides two very important effects, or not only prevents any formation of void due to electromigration, but also allows a possible high density integration in the two dimensional direction.

Figure 4A:
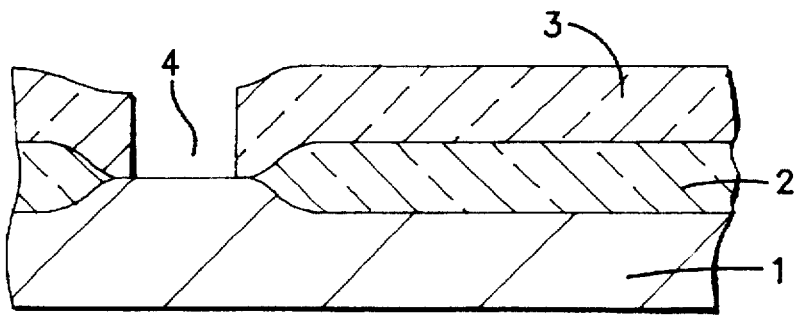
FIGS. 4A through 4E are fragmentary cross sectional elevation views illustrative of novel multilevel interconnections and contact holes within inter-layer insulators in sequential steps involved in a novel fabrication method in a first embodiment according to the present invention.

The above novel multilevel interconnection layers may be fabricated as follows. As illustrated in FIG. 4A, a silicon substrate 1 is prepared and then subjected to a local oxidation of silicon to selectively form a field oxide film 2 on a top surface of the silicon substrate 1. The field oxide film 2 is formed on a passive region and an active region is not covered by the field oxide film 2. The selective formation of the field oxide film 2 defines the active region. A silicon oxide film having a thickness of 150 nanometers is formed on an entire surface of the substrate to cover both the field oxide film 2 and the active region of the silicon substrate 1. Further, a boron phosphate silicate glass film (BPSG film) having a thickness of 650 nanometers is deposited on an entire surface of the silicon oxide film so as to form a first inter-layer insulator 3. The first inter-layer insulator 3 is selectively etched to form a first contact hole 4 over the active region of the silicon substrate 1. As a result, a part of the active region, not covered by the field oxide film 2, of the silicon substrate 1 is exposed through the first contact hole 4.

Figure 4B:
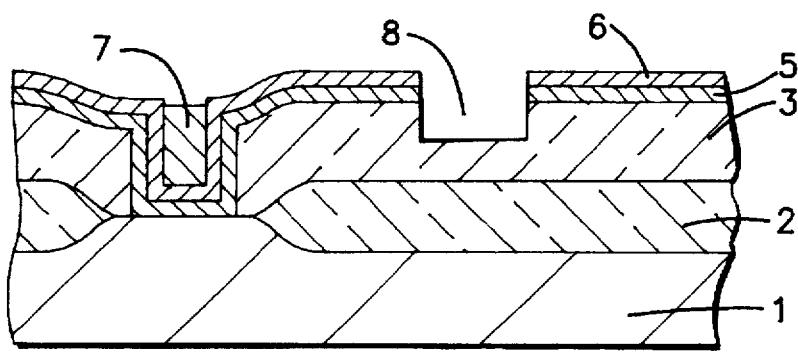

As illustrated in FIG. 4B, a titanium film 5 having a thickness of 60 nanometers is deposited by sputtering on an entire surface of the substrate so that the titanium film 5 extends on the top surface of the first inter-layer insulator 3 and further extends both on a vertical side wall of the first contact hole 4 and on the bottom of the first contact hole 4 so that the titanium film 5 at the bottom of the first contact hole 4 is in contact with a part of the top surface on the active region of the silicon substrate 1. A titanium nitride film 6 having a thickness of 100 nanometers is deposited by sputtering on an entire surface of the titanium film 5. As a result, the titanium nitride film 6 extends in an almost horizontal direction over the first inter-layer insulator and further resides within the first contact hole 4. Laminations of the titanium film 5 and the titanium nitride film 6 serve as a barrier layer. A tungsten film is deposited by a chemical vapor deposition method on an entire surface of the titanium nitride film 6 so that the tungsten film not only extends over the first inter-layer insulator 3 but also reside within the first contact hole 4 to fill up the contact hole 4 with the tungsten film, the titanium nitride film 6 and the titanium film 5. The tungsten film deposited is then subjected to en etch back in order to leave the tungsten film only within the first contact hole 4. The remaining part of the tungsten film 7 serves as a tungsten plug 7. The laminations of the titanium nitride film 6 and the titanium film 5 are selectively removed by a reactive ion-etching which uses a mixture gas of $CHF_3$ and $O_2$. Subsequently, the first inter-layer insulator 3 is also selectively removed by a reactive ion-etching which uses a mixture gas of $CH_3$ and $O_2$ so as to form a first aperture 8 over the field oxide film 2. The first aperture 8 extends vertically from the titanium nitride film 6 through the titanium film 5 into the first inter-layer insulator 3, provided the bottom of the first aperture 8 does not reach an interface between the first inter-layer insulator 3 and the field oxide film 2. The bottom of the first aperture 8 is separated by the first inter-layer insulator 3 from the top of the field oxide film 2.

Figure 4C:
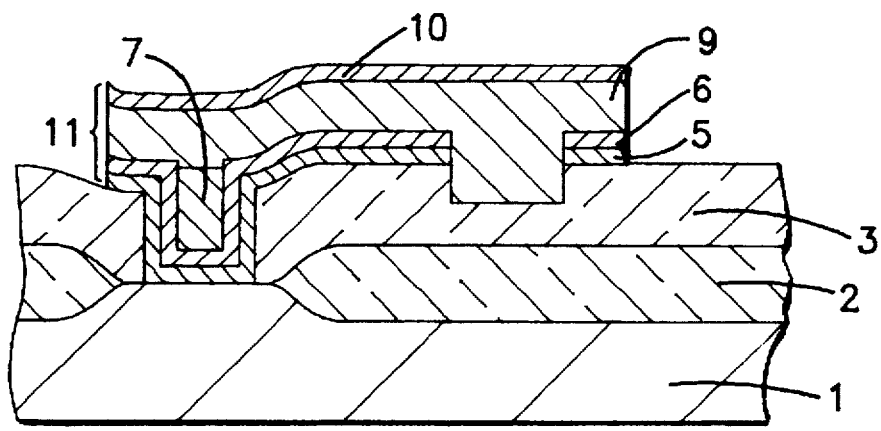

As illustrated in FIG. 4C, an aluminum film 9 having a thickness 450 nanometers is entirely deposited by sputtering not only on the titanium nitride film 6 but also within the first aperture 8. Subsequently, the deposited aluminum film 9 is subjected to a heat treatment at a temperature of 450° C. so that deposited aluminum 9 shows a reflow and thus the first aperture 8 is filled up with the aluminum film 9. A titanium film 10 having a thickness of 50 nanometers is deposited by sputtering on an entire surface of the aluminum film 9. The titanium nitride film 10, the aluminum film 9, the titanium nitride film 6 and the titanium film 5 are sequentially and selectively etched and thus patterned to thereby form a first interconnection layer 11. The first interconnection layer is connected to the active region of the silicon substrate 1 via the first contact hole 4.

Figure 4D:
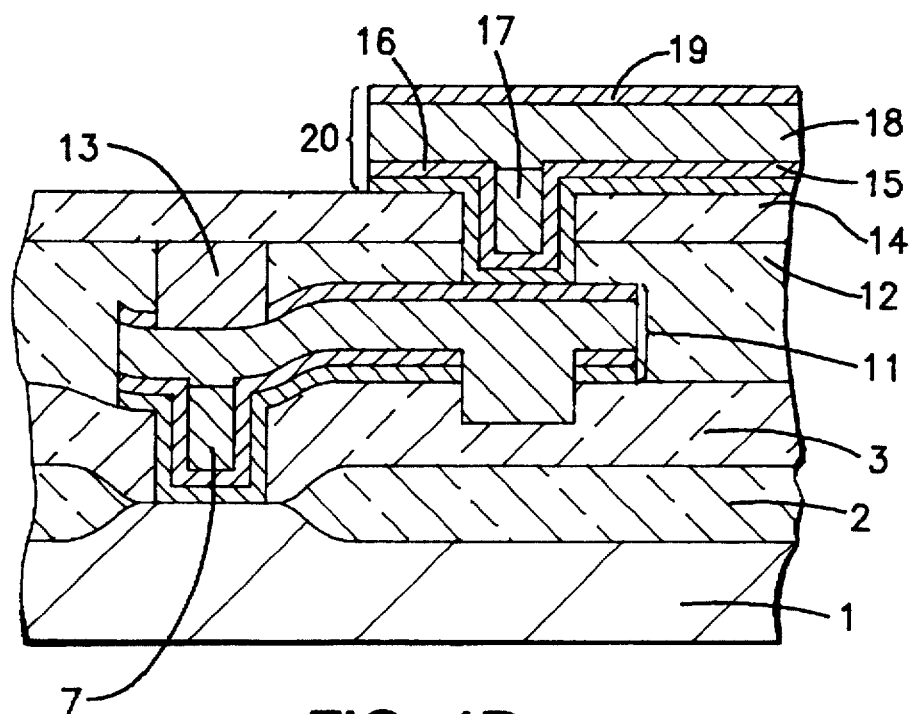

As illustrated in FIG. 4D, a silicon oxide film 12 having a thickness of approximately 1.2 micrometers is deposited by a plasma chemical vapor deposition on an entire surface of the substrate so that the silicon oxide film 12 covers the first interconnection layer 11 and the top surface of the first inter-layer insulator 12. Subsequently, the deposited silicon oxide film 12 is plagiarized by chemical or mechanical polishing so that the silicon oxide film 12 over the first interconnection layer has a thickness of 400 nanometers. The silicon oxide film 12 and the titanium nitride film 10 are selectively etched to form a second aperture over the first contact hole 4 so that the aluminum film 9 is exposed through the second aperture. An aluminum film 13 having a thickness of 800 nanometers is entirely deposited by sputtering both on the top surface of the silicon oxide film 12 and within the second aperture. The deposited aluminum film 13 is subjected to a heat treatment at a temperature of 450° C. to cause a reflow of the aluminum film 13. As a result, the second aperture is filled up with the aluminum film 13. The aluminum film 13 is selectively removed by a chemical and mechanical polishing to leave the aluminum film 13 only within the second aperture. A silicon oxide film 14 having a thickness of 400 nanometers is deposited by sputtering on the silicon oxide film 12 and on the aluminum film 13 so as to form a second inter-layer insulator which comprises the silicon oxide film 12 and the silicon oxide film 14. The second inter-layer insulator is selectively etched by a reactive ion-etching which uses a mixture gas of $CHF_3$ and $O_2$ so as to form a second contact hole over the first aperture. As a result, a part of the titanium nitride film 10 on the aluminum layer 9 is exposed through the second contact hole. A titanium film 15 having a thickness of 30 nanometers is entirely deposited by sputtering on a top surface of the silicon oxide film 14 and further on both a vertical wall and a bottom of the second contact hole so that the titanium film 15 is in contact with the titanium nitride film 10 covering the aluminum film 9. A titanium nitride film 16 having a thickness of 100 nanometers is deposited by sputtering on an entire surface of the titanium film 15 so that the titanium nitride film 16 extends over the silicon oxide film 14 and within the second contact hole. A tungsten film is entirely deposited by chemical vapor deposition on the titanium nitride film 16 so that the tungsten film extends over the silicon oxide film 14 and resides within the second contact hole, wherein the second contact hole is filled up with the tungsten film and the laminations of the titanium film 15 and the titanium nitride film 16. The deposited tungsten film is subjected to etch back so that the tungsten film remains only within the second contact hole The remaining part of the tungsten film serves as a tungsten plug 17. An aluminum film 18 having a thickness of 600 nanometers is entirely deposited both on the titanium nitride film 16 and on the tungsten plug 17. A titanium nitride film 19 having a thickness of 50 nanometers is entirely deposited by sputtering on the aluminum film 18. The titanium nitride film 19, the aluminum film 18, the titanium nitride film 15 and the titanium film 14 are selectively etched and thus patterned to form a second interconnection layer 20 which comprises the titanium film 15, the titanium nitride film 16, the aluminum film 18 and the titanium nitride film 19.

Figure 4E:
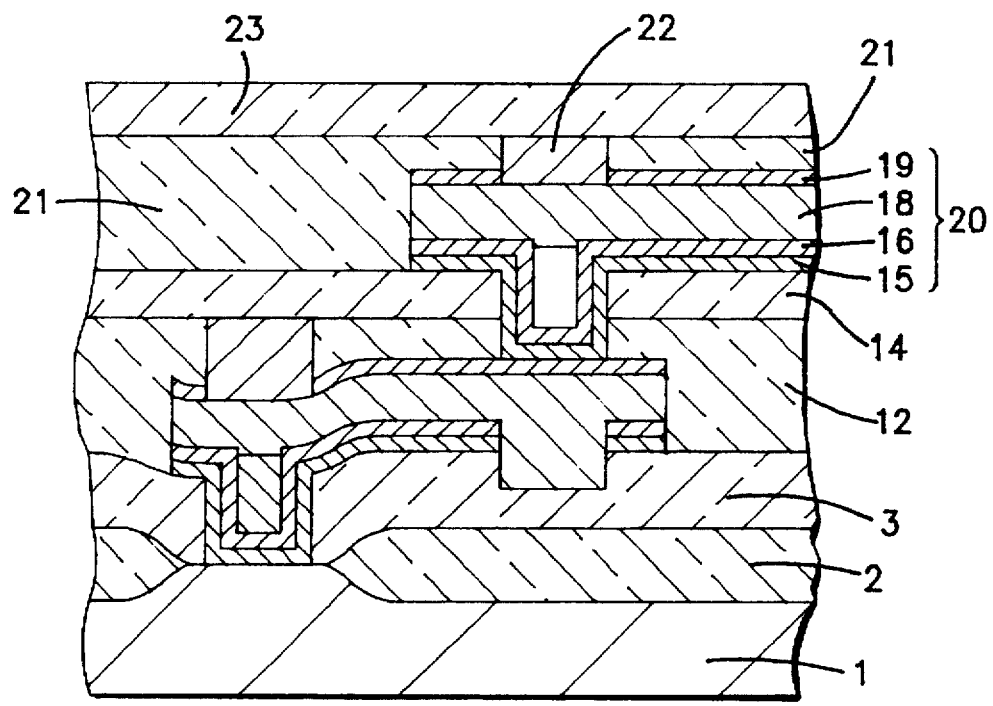

As illustrated in FIG. 4E, a silicon oxide film 21 having a thickness of about 2.1 micrometers is entirely deposited by a plasma chemical vapor deposition to cover the second inter-layer insulator 20 and the silicon oxide film 14. The deposited silicon oxide film 21 is then plagiarized by a chemical and mechanical polishing so that the silicon oxide film 21 over the second interconnection layer 20 has a thickness of 400 nanometers. The plagiarized silicon oxide film 21 and the titanium nitride film 19 are selectively etched by a reactive ion-etching which uses $CHF_3$ and $O_2$ to form a third aperture over the second contact hole so that a part of the aluminum film 18 is exposed through the third aperture. An aluminum film 22 is deposited on the silicon oxide film 21 and within the third aperture. The deposited aluminum film 22 is then subjected to a heat treatment at a temperature of 450° C. to cause a reflow of the aluminum film 22 so that the third aperture is filled up with the aluminum film 22. The aluminum film 22 is then selectively removed by a chemical and mechanical polishing so as to leave the aluminum film 22 only within the third aperture. A silicon oxide film 23 having a thickness of 500 nanometers is entirely deposited by a plasma chemical vapor deposition on the silicon oxide film 23 and the aluminum film 22. The deposited silicon oxide film 23 serves as a protection film.

A second embodiment according to the present invention will be described with reference to FIGS. 5A through 5E, wherein a novel structure of multilevel interconnection layers extending within inter-layer insulators and being connected to each other through a contact layer. The novel multilevel interconnection layers are structurally and physically improved not only to allow a high density integration of the interconnection layers but also to prevent ally void formation due to electromigration of aluminum atoms in the interconnection layers.

The structure of the novel multilevel interconnection layers will be described with reference to FIG. 5E. Field oxide films 2 are selectively formed on a top surface of a silicon substrate 1 so that a passive region is defined as a region on which the field oxide films are formed and an active region is defined as a region on which no field oxide film is formed. A first inter-layer insulator 3 extends both on We field oxide film 2 and the active region of the silicon substrate 1. A first contact hole is provided which vertically extends from the active region of the silicon substrate 1 to the top surface of the first inter-layer insulator 3. The first contact hole has the bottom portion and a side wall, both of which are covered by a titanium film. A titanium nitride film is provided which extends on the titanium film. A tungsten plug is provided on the titanium nitride film so that the first contact hole is filled up both with the laminations of the titanium film and the titanium nitride film and with the tungsten plug.

A silicon oxide film 12 is provided on the first inter-layer insulator 3. A silicon oxide film 14 is provided on the silicon oxide film 12 so that the silicon oxide films 12 and 14 constitute a second inter-layer insulator. A first interconnection layer almost horizontally extends on fie first inter-layer insulator and within the silicon oxide film 12. The first interconnection layer comprises an aluminum film 9 coated by a titanium nitride film and by the laminations of the titanium film and the titanium nitride film. The first interconnection layer has a first end portion which is in contact with the top portion of the first contact layer within the first contact hole. The first contact layer extends downward from the first end portion of the first interconnection layer. The first end portion of the first interconnection layer also has a fist reservoir portion which extends therefrom upwardly. The first reservoir portion is made of aluminum and which is in contact directly with the aluminum film of the first interconnection layer. The first reservoir portion has the top which reaches an interface between the silicon oxide film 12 and a silicon oxide film 14 extending on the silicon oxide film 12. The first reservoir portion and the first contact hole extend from the first end portion of the first interconnection layer in the upward and downward directions, namely the opposite directions. The first reservoir portion has the same plane size as the first interconnection layer. In the plane view, the first reservoir portion is included in the first interconnection layer without extending outside the first interconnection. This means that providing the reservoir results in no increase in the necessary area thereby allowing a high density integration. The first reservoir is to supply aluminum atoms to the first end portion of the aluminum film 9 of the first interconnection layer. When electron currents flow from the first contact layer to the aluminum film of the first interconnection layer, then any void is likely to be formed due to electromigration in the aluminum film near a boundary between the aluminum film and the tungsten plug since aluminum has a smaller electromigration resistance than that of tungsten. If, however, ally void is about to be formed due to electromigration, then immediately aluminum atoms in the reservoir portion move toward the position at which a void is about to be formed. Whilst aluminum atoms migrate from the boundary region along the electron current, a sufficient amount of fresh aluminum atoms are supplied from the reservoir portion to the boundary portion, to the tungsten film, of the aluminum film. For this reason, almost no void is formed due to electromigration. Accordingly, providing the reservoir portion near the boundary between the aluminum film and the tungsten plug can prevent any formation of void due to electromigration for the above reason.

The first interconnection layer has a second end portion which is in contact with a second contact layer provided within a second contact hole. The second contact layer includes a secondary reservoir made of aluminum separately from a second reservoir portion which extends downward from the second end of the first interconnection layer. The second contact hole extends upward from the second end portion of the first interconnection layer. The second contact layer structurally differs from the first contact layer. The second contact layer comprises an aluminum film which extends on a vertical side wall of the second contact hole and residing at a bottom of the second contact hole. A titanium film 25 extends on the aluminum film. A titanium nitride film 26 extends on the titanium film 25. a tungsten plug is provided within the second contact hole so that the second contact hole is filled up with the aluminum film 24, the titanium film 25, the titanium nitride film 26 and the tungsten plug 27. If the electron current flows from the second contact film to tire first interconnection layer, a part of the electron current flows across the titanium film 25 and the titanium nitride film 26. This electron current may cause a formation of a void in the aluminum film 24 at the bottom of the second contact hole. If such void is about to be formed due to electromigration in the aluminum film at the bottom of the second contact hole, then aluminum atoms are supplied from not only the second reservoir but also the aluminum film 24. Aluminum atoms in the aluminum film 24 migrate from the vertical portion of the aluminum film to the bottom part thereof. This ensures prevention of any formation of the void due to electromigration. A silicon oxide film 30 extends on the second interconnection layer and on the silicon oxide film 24. A silicon oxide nitride film 31 is provided to cover the silicon oxide film 31.

As described above, the reservoir portion and the contact hole extend from the end portion of the interconnection layer in the upward and downward directions, namely the opposite directions. The reservoir portion has the same plane size as the interconnection layer. In the plane view, the reservoir portion is included in the interconnection layer without extending outside the interconnection. This means that providing the reservoir results in no increase in the necessary area thereby allowing a high density integration. Further, the secondary reservoir, the aluminum film 24 is provided within the contact hole. This means that providing the secondary reservoir results in no increase in the necessary area thereby allowing a high density integration.

Both the reservoir and secondary reservoir supply aluminum atoms to the end portion of the aluminum film of the interconnection layer. When electron currents flow from the contact layer to the aluminum film of the interconnection layer, then any void is likely to be formed due to electromigration in the aluminum film near a boundary between the aluminum film and the tungsten plug or the titanium nitride film since aluminum has a smaller electromigration resistance than that of tungsten or titanium nitride. If, however, any void is about to be formed due to electromigration, then immediately aluminum atoms in the reservoir portion move or migrate toward the position at which a void is about to be formed. Whilst aluminum atoms migrate from the boundary region along the electron current, a sufficient amount of fresh aluminum atoms are supplied from the reservoir portion to the boundary portion, to the tungsten film, of the aluminum film. For this reason, almost no void is formed due to electromigration. Accordingly, providing the reservoir portion near the boundary between the aluminum film and the tungsten plug or titanium nitride can prevent any formation of void due to electromigration for the above reason. Further, the reservoir portion is provided so that no part of the reservoir portion extends outwardly from the interconnection layers in horizontal directions. Needless to say, this structural condition is very important for realizing a possible high density integration in the two dimensional direction of the semiconductor device including multilevel interconnections. Therefore, the reservoir portion with the secondary reservoir portion of the present invention provides two very important effects, or not only prevents any formation of void due to electromigration, but also allows a possible high density integration in the two dimensional direction.

Figure 5A:
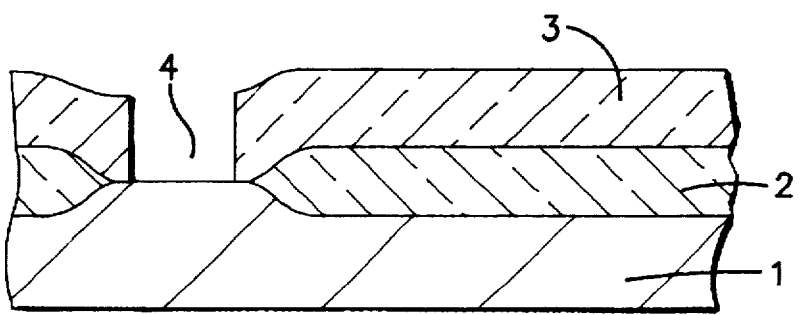
FIGS. 5A through 5E are fragmentary cross sectional elevation views illustrative of novel multilevel interconnections and contact holes within inter-layer insulators in sequential steps involved in a novel fabrication method in a first embodiment according to the present invention.

The above novel multilevel interconnection layers may be fabricated as follows. As illustrated in FIG. 5A, a silicon substrate 1 is prepared and the subjected to a local oxidation of silicon to selectively form a field oxide film 2 on a top surface of the silicon substrate 1. The field oxide film 2 is formed on a passive region and an active region is not covered by the field oxide film 2. The selective formation of the field oxide film 2 defines the active region. A silicon oxide film having a thickness of 150 nanometers is formed on an entire surface of the substrate to cover both the field oxide film 2 and the active region of the silicon substrate 1. Further, a boron phosphate silicate glass film (BPSG film) having a thickness of 650 nanometers is deposited on an entire surface of the silicon oxide film so as to form a first inter-layer insulator 3. The first inter-layer insulator 3 is selectively etched to form a first contact hole 4 over the active region of the silicon substrate 1. As a result, a part of the active region, not covered by the field oxide film 2, of the silicon substrate 1 is exposed through the first contact hole 4.

Figure 5B:
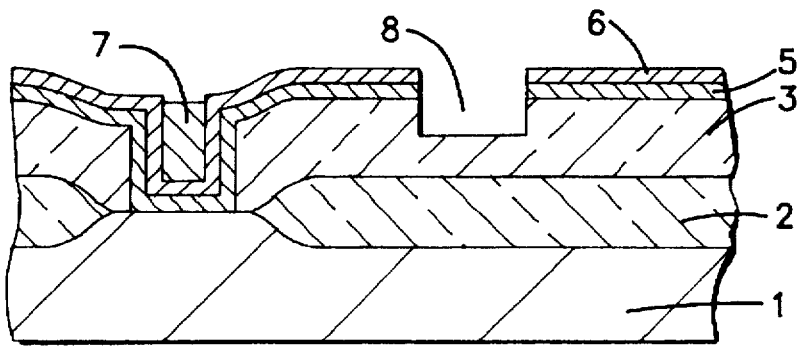

As illustrated in FIG. 5B, a titanium film 5 having a thickness of 60 nanometers is deposited by sputtering on an entire surface of the substrate so that the titanium film 5 extends on the top surface of the first inter-layer insulator 3 and further extends both on a vertical side wall of the first contact hole 4 and on the bottom of the first contact hole 4 so that the titanium film 5 at the bottom of the first contact hole 4 is in contact with a part of the top surface on the active region of the silicon substrate 1. A titanium nitride film 6 having a thickness of 100 nanometers is deposited by sputtering on an entire surface of the titanium film 5. As a result, the titanium nitride film 6 extends in an almost horizontal direction over the first inter-layer insulator and further resides within the first contact hole 4. Laminations of the titanium film 5 and the titanium nitride film 6 serve as a barrier layer. A tungsten film is deposited by a chemical vapor deposition method on an entire surface of the titanium nitride film 6 so that the tungsten film not only extends over the first inter-layer insulator 3 but also reside within the first contact hole 4 to fill up the contact hole 4 with the tungsten film, the titanium nitride film 6 and the titanium film 5. The tungsten film deposited is then subjected to en etch back in order to leave the tungsten film only within the first contact hole 4. The remaining part of the tungsten film 7 serves as a tungsten plug 7. The laminations of the titanium nitride fit 6 and the titanium film 5 are selectively removed by a reactive ion-etching which uses a mixture gas of $CHF_3$ and $O_2$. Subsequently, the first inter-layer insulator 3 is also selectively removed by a reactive ion-etching which uses a mixture gas of $CHF_3$ and $O_2$ so as to form a first aperture 8 over the field oxide film 2. The first aperture 8 extends vertically from the titanium nitride film 6 through the titanium film 5 into the first inter-layer insulator 3, provided the bottom of the first aperture 8 does not reach an interface between the first inter-layer insulator 3 and the field oxide film 2. The bottom of the first aperture 8 is separated by the first inter-layer insulator 3 from the top of the field oxide film 2.

Figure 5E:
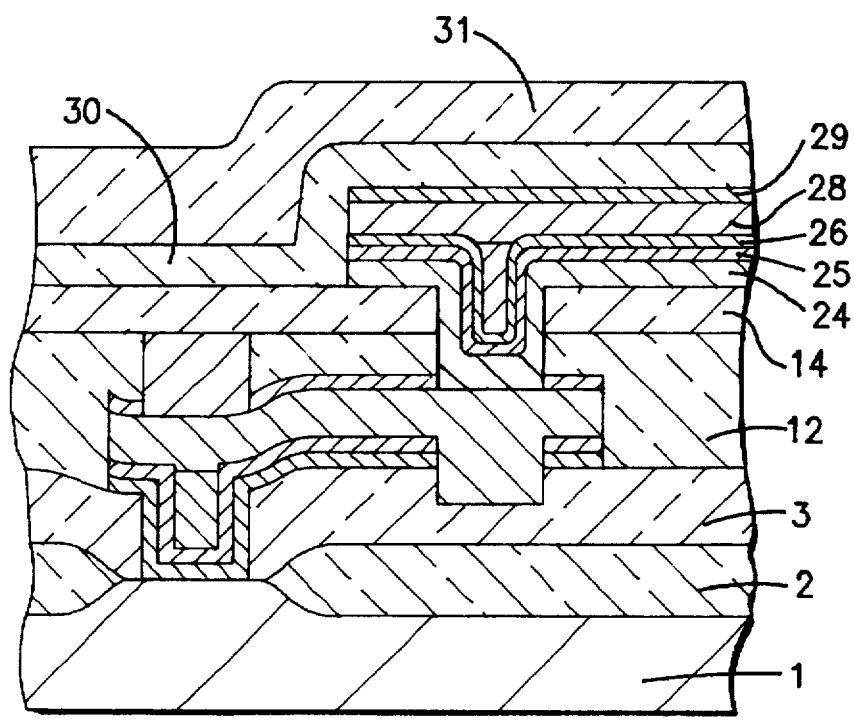
Figure 5C:
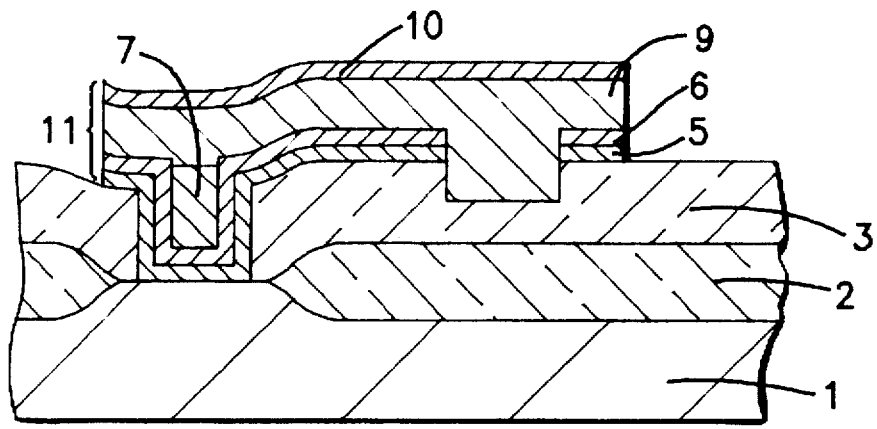

As illustrated in FIG. 5C, an aluminum film 9 having a thickness 450 nanometers is entirely deposited by sputtering not only on the titanium nitride film 6 but also within the first aperture 8 Subsequently, the deposited aluminum film 9 is subjected to a heat treatment at a temperature of 450° C. so that the deposited aluminum 9 shows a reflow and thus the first aperture 8 is filled up with tie aluminum film 9. A titanium film 10 having a thickness of 50 nanometers is deposited by sputtering on an entire surface of the aluminum film 9. The titanium nitride film 10, the aluminum film 9, the titanium nitride film 6 and the titanium film 5 are sequentially and selectively etched and thus patterned to thereby form a first interconnection layer 11. The first interconnection layer is connected to the active region of the silicon substrate 1 via the first contact hole 4.

Figure 5D:
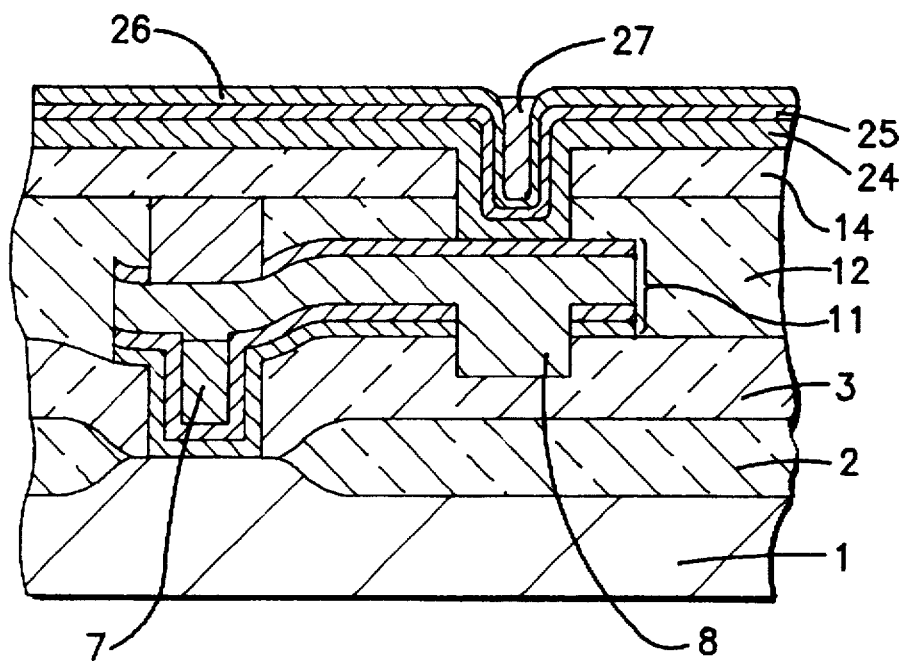

As illustrated in FIG. 5D, a silicon oxide film 12 having a thickness of approximately 1.2 micrometers is deposited by a plasma chemical vapor deposition on an entire surface of the substrate so that the silicon oxide film 12 covers the first interconnection layer 11 and the top surface of the first inter-layer insulator 12. Subsequently, the deposited silicon oxide film 12 is plagiarized by chemical or mechanical polishing so that the silicon oxide film 12 over the first interconnection layer has a thickness of 400 nanometers. The silicon oxide film 12 and the titanium nitride film 10 are selectively etched to form a second aperture over the first contact hole 4 so that the aluminum film 9 is exposed through the second aperture. An aluminum film 13 having a thickness of 800 nanometers is entirely deposited by sputtering both on the top surface of the silicon oxide film 12 and within the second aperture. The deposited aluminum film 13 is subjected to a heat treatment at a temperature of 450° C. to cause a reflow of the aluminum film 13. As a results the second aperture is filled up with the aluminum film 13. The aluminum film 13 is selectively removed by a chemical and mechanical polishing to leave the aluminum film 13 only within the second aperture. A silicon oxide film 14 having a thickness of 400 nanometers is deposited by sputtering on the silicon oxide film 12 and on the aluminum film 13 so as to form a second inter-layer insulator which comprises the silicon oxide film 12 and the silicon oxide film 14. The second inter-layer insulator is selectively etched by a reactive ion-etching which uses a mixture gas of $CHF_3$ and $O_2$ so as to form a second contact hole over the first aperture. As a result, a part of the titanium nitride film 10 on the aluminum layer 9 is exposed through the second contact hole. An aluminum film 24 having a thickness of 200 nanometers is entirely deposited by sputtering not only on the top surface of the silicon oxide film 14 but also on both a vertical side wall and a bottom of the second contact hole so that the aluminum film 24 at the bottom of the second contact hole is in contact with the aluminum film 9. The deposited aluminum film 24 is subjected to a heat treatment at a temperature of 450° C. to cause a reflow of the aluminum film 24. The thickness of the aluminum film 24 at the bottom of the contact hole is increased by the reflow. The increase in thickness of the aluminum film 24 at the bottom of the contact hole both prevents any disconnection and-keeps the conformable shape at the bottom of the contact hole. A titanium film 25 having a thickness of 30 nanometers is entirely deposited by sputtering on a top surface of the aluminum film 24. The above conformable shape of the aluminum film 24 at the bottom of the contact hole provides a good step coverage of the titanium film 25 in the vicinity of the bottom of the contact hole. A titanium nitride film 26 having a thickness of 100 nanometers is deposited by sputtering on an entire surface of the titanium film 25. A tungsten film is entirely deposited by chemical vapor deposition on the titanium nitride film 26 so that the tungsten film extends over the silicon oxide film 24 and resides with the second contact hole, wherein the second contact hole is filled up with the tungsten film and the laminations of the titanium film 25 and the titanium nitride film 26. The deposited tungsten film is subjected to etch back so that the tungsten film remains only within the second contact hole. The remaining part of the tungsten film serves as a tungsten plug 27.

As illustrated in FIG. 5E, an aluminum film 28 having a thickness of 400 nanometers is entirely deposited both on the titanium nitride film 26 and on the tungsten plug 27. A titanium nitride film 29 having a thickness of 50 nanometers is entirely deposited by sputtering on the aluminum film 28. The titanium nitride film 29, the aluminum film 28, the titanium nitride film 26, the titanium film 25 and the aluminum film 24 are selectively etched and thus patterned to form a second interconnection layer which comprises the aluminum film 24, the titanium film 25 the titanium nitride film 26, the aluminum film 28 and the titanium nitride film 29. A silicon oxide film 30 having a thickness of 200 nanometers is entirely deposited by chemical vapor deposition to cover the second interconnection layer and the silicon oxide film 24. A silicon oxide nitride film 31 is then entirely deposited by chemical vapor deposition on an entire surface of the silicon oxide film 30 so that laminations of the silicon oxide film 30 and the silicon oxide nitride film 31 serve as a protection layer.

Figure 6:
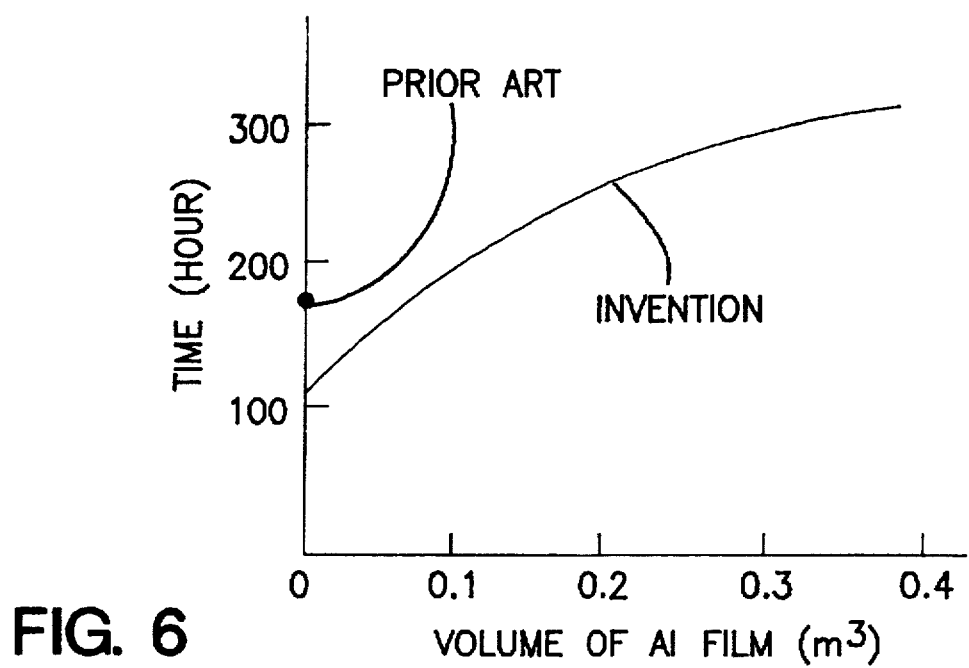
FIG. 6 is a diagram illustrative of times until a half of sample interconnection layers comes into disconnection versus a volume of aluminum film within a contact hole both in the prior art and in the present invention.

FIG. 6 illustrates a relationship between a time until any disconnection appears versus a voltage of aluminum within a hole. The time was measured under the following conditions. The width of the interconnection layer is 0.8 micrometers. The size of the contact hole is 0.6 micrometers×0.6 micrometers. No seat of the contact hole exist. Temperature is 250° C. The density of current is 3×105 Acm2. There is measured a time until disconnection appear for a half of any samples versus a volume of aluminum film. The time is nearly proportional to the volume of the aluminum film.

A third embodiment according to the present invention will be described with reference to FIG. 7, wherein a novel structure of multilevel interconnection layers extending within inter-layer insulators and being connected to each other through a contact layer. The novel multilevel interconnection layers are structurally and physically improved not only to allow a high density integration of the interconnection layers but also to prevent any void formation due to electromigration of aluminum atoms in the interconnection layers.

Figure 7:
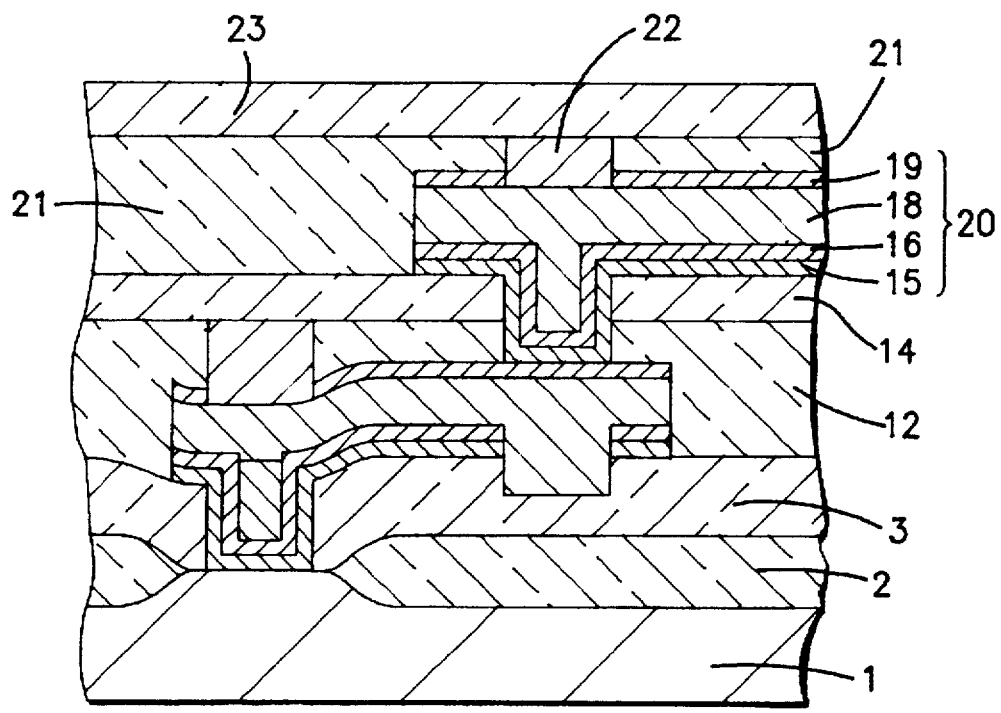
FIG. 7 is a fragmentary cross sectional elevation view illustrative of novel structure of multilevel interconnections and a contact hole in a third embodiment according to the present invention.

The structure of the novel multilevel interconnection layers is illustrated in FIG. 7 from which the interconnections structurally differs from that of the first embodiment in view of the second contact layer including all aluminum film in place of tungsten plug. Ally other structural points are the same as those of the first embodiment.

The reservoir portion and the contact hole extend from the end portion of the interconnection layer in the upward and downward directions, namely the opposite directions. The reservoir portion has the same plane size as the interconnection layer. In the plane view, the reservoir portion is included in the interconnection layer without extending outside the interconnection. This means that providing the reservoir results in no increase in the necessary area thereby allowing a high density integration.

The reservoir supplies aluminum atoms to the end portion of the aluminum film of the interconnection layer. When electron currents flow from the contact layer to the aluminum film of the interconnection layers, then any void is likely to be formed due to electromigration in the aluminum film near a boundary between the aluminum film and the tungsten plug or the titanium nitride film since aluminum has a smaller electromigration resistance than that of tungsten or titanium nitride. If, however, any void is about to be formed due to electromigration, then immediately aluminum atoms in the reservoir portion move or migrate toward the position at which a void is about to be formed. Whilst aluminum atoms migrate from the boundary region along the electron current, a sufficient amount of fresh aluminum atoms are supplied from the reservoir portion to the boundary portion, to the tungsten film, of the aluminum film. For this reason, almost no void is formed due to electromigration. Accordingly, providing the reservoir portion near the boundary between the aluminum film and the tungsten plug or titanium nitride can prevent any formation of a void due to electromigration for the above reason. Further the reservoir portion is provided so that no part of the reservoir portion extends outwardly from the interconnection layers in horizontal directions. Needless to say, this structural condition is very important for realizing a possible high density integration in the two dimensional direction of the semiconductor device including multilevel interconnections. Therefore, the reservoir portion of the present invention provides two very important effects, or not only prevents any formation of void due to electromigration, but also allows a possible high density integration in the two dimensional direction.

A fourth embodiment according to the present invention will be described with reference to FIG. 8, wherein a novel structure of multilevel interconnection layers extending within inter-layer insulators and being connected to each other through a contact layer. The novel multilevel interconnection layers are structurally and physically improved not only to allow a high density integration of the interconnection layers but also to prevent any void formation due to electromigration of aluminum atoms in the interconnection layers.

Figure 8:
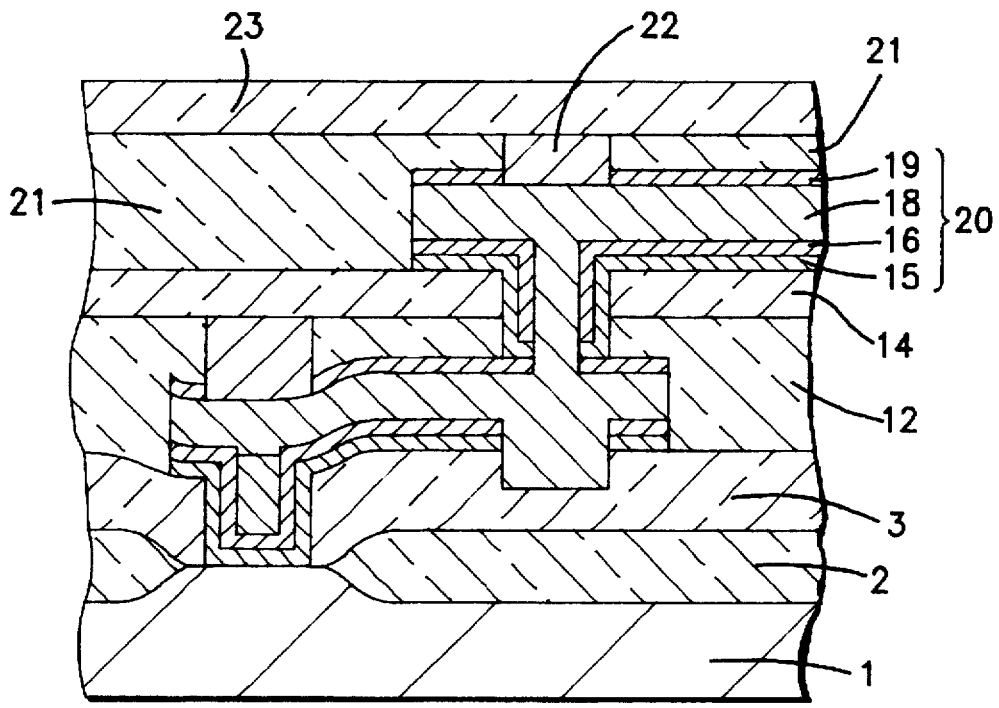
FIG. 8 is a fragmentary cross sectional elevation view illustrative of novel structure of multilevel interconnections and a contact hole in a fourth embodiment according to the present invention.

The structure of the novel multilevel interconnection layers is illustrated in FIG. 8 from which the interconnections structurally differs from that of the third embodiment in view of the first and second interconnection layers are connected through an aluminum film without through the titanium film or the titanium nitride film. Any other structural points are the same as those of the first embodiment.

In this case, the formation of void may be caused at a turning point of the current passage where there is a current density peak.

The reservoir portion and the contact hole extend from the end portion of the interconnection layer in the upward and downward directions, namely the opposite directions. The reservoir portion has the same plane size as the interconnection layer. In the plane view, the reservoir portion is included in the interconnection layer without extending outside the interconnection. This means that providing the reservoir results in no increase in the necessary area thereby allowing a high density integration.

The reservoir supplies aluminum atoms to the turning point of the current passage of the interconnection layer. When electron currents flow from the contact layer to the aluminum film of the interconnection layer, then any void is likely to be formed due to electromigration in the aluminum film near the turning point of the current passage of the interconnection layer. If, however, any void is about to be formed due to electromigration, then immediately aluminum atoms in the reservoir portion move or migrate toward the position at which a void is about to be formed. Whilst aluminum atoms migrate from the turning point of the current passage of the interconnection layer, a sufficient amount of fresh aluminum atoms is supplied from the reservoir portion to the turning point of the current passage of the interconnection layer. For this reason, almost no void is formed due to electromigration. Accordingly, providing the reservoir portion near the turning point of the current passage of the interconnection layer can prevent any formation of void due to electromigration for the above reason. Further, the reservoir portion is provided so that no part of the reservoir portion extends outwardly from the interconnection layers in horizontal directions. Needless to say, thus structural condition is very important for realizing a possible high density integration in the two dimensional direction of the semiconductor device including multilevel interconnections. Therefore, the reservoir portion of the present invention provides two very important effects, or not only prevents any formation of void due to electromigration, but also allows a possible high density integration in the two dimensional direction.

Figure 9:
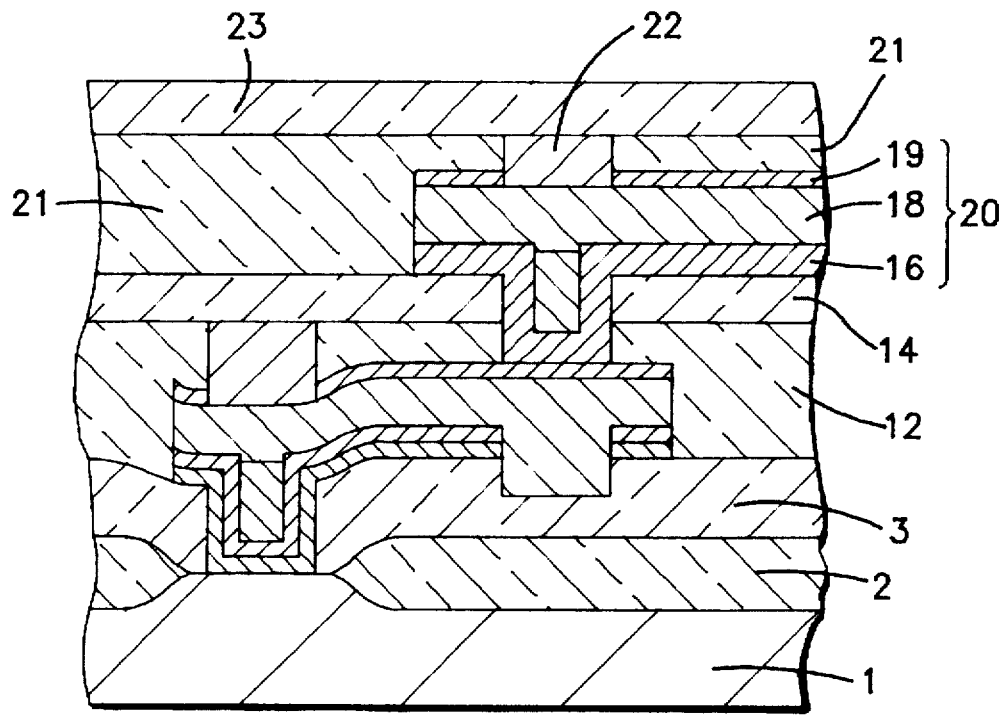
FIG. 9 is a fragmentary cross sectional elevation view illustrative of novel structure of multilevel interconnections and a contact hole in a fifth embodiment according to the present invention.

A fifth embodiment according to the present invention will be described with reference to FIG. 9, wherein a novel structure of multilevel interconnection layers extending within inter-layer insulators and being connected to each other through a contact layer. The novel multilevel interconnection layers are structurally and physically improved not only to allow a high density integration of the interconnection layers but also to prevent ally void formation due to electromigration of aluminum atoms in the interconnection layers The structure of the novel multilevel interconnection layers is illustrated in FIG. 9 from which the interconnections structurally differs from that of the first embodiment in view of the second contact layer including a single titanium nitride film 16. Any other structural points are the same as those of the first embodiment.

The reservoir portion and the contact hole extend from the end portion of the interconnection layer in the upward and downward directions, namely the opposite directions. The reservoir portion has the same plane size as the interconnection layer. In the plane view, the reservoir portion is included in the interconnection layer without extending outside the interconnection. This means that providing the reservoir results in no increase in the necessary area thereby allowing a high density integration The reservoir supplies aluminum atoms to the end portion of the aluminum film of the interconnection layer. When electron currents flow from the contact layer to the aluminum film of the interconnection layer, then any void is likely to be formed due to electromigration in the aluminum film near a boundary between the aluminum film and the tungsten plug or the titanium nitride film since aluminum has a smaller electromigration resistance than that of tungsten or titanium nitride. If, however, any void is about to be formed due to electromigration, then immediately aluminum atoms in the reservoir portion move or migrate toward the position at which a void is about to be formed. Whilst aluminum atoms migrate from the boundary region along the electron current, a sufficient amount of fresh aluminum atoms are supplied from the reservoir portion to the boundary portion, to the tungsten film, of the aluminum film. For this reason, almost no void is formed due to electromigration. Accordingly, providing the reservoir portion near the boundary between the aluminum film and the tungsten plug or titanium nitride can prevent any formation of void due to electromigration for the above reason. Further, the reservoir portion is provided so that no part of the reservoir portion extends outwardly from the interconnection layers in horizontal directions. Needless to say, this structural condition is very important for realizing a possible high density integration in the two dimensional direction of the semiconductor device including multilevel interconnections. Therefore, the reservoir portion of the present invention provides two very important effects, or not only prevents any formation of void due to electromigration, but also allows a possible high density integration in the two dimensional direction.

A sixth embodiment according to the present invention will be described with reference to FIG. 10, wherein a novel structure of multi-level interconnection layers extending within inter-layer insulators and being connected to each other through a contact layer. The novel multilevel interconnection layers are structurally and physically improved not only to allow a high density integration of the interconnection layers but also to prevent any void formation due to electromigration of aluminum atoms in the interconnection layers.

Figure 10:
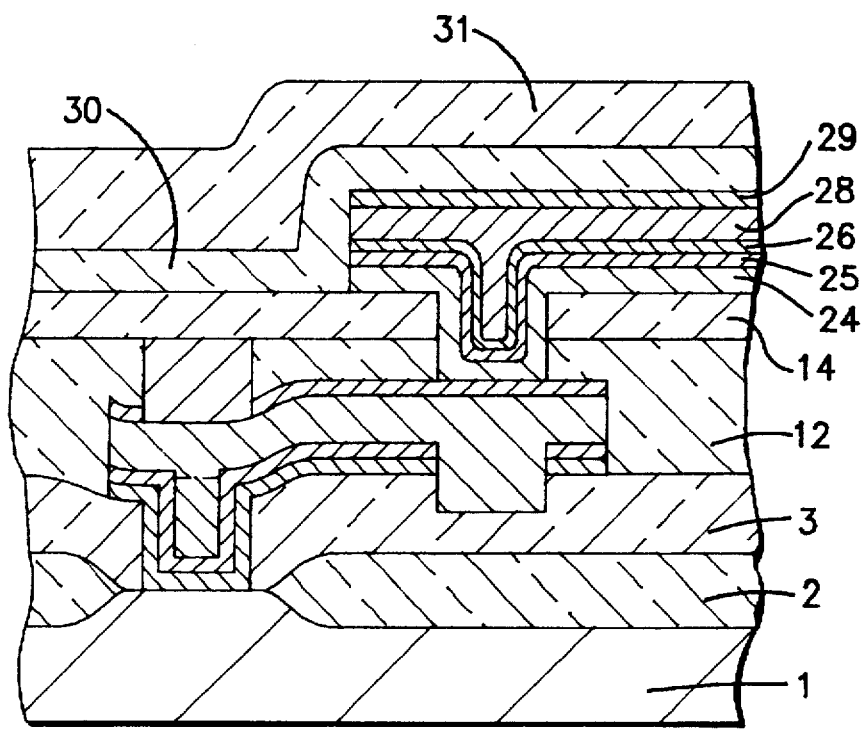
FIG. 10 is a fragmentary cross sectional elevation view illustrative of novel structure of multilevel interconnections and a contact hole in a sixth embodiment according to the present invention.

The structure of the novel multilevel interconnection layers is illustrated in FIG. 10 from which the interconnections structurally differs from that of the second embodiment in view of the second contact layer including an aluminum film in place of tungsten plug. Any other structural points are the same as those of the second embodiment.

As described above, the reservoir portion and the contact hole extend from the end portion of the interconnection layer in the upward and downward directions, namely the opposite directions. The reservoir portion has the same plane size as the interconnection layer. In the plane view, the reservoir portion is included in the interconnection layer without extending outside the interconnection. This means that providing the reservoir results in no increase in the necessary area thereby allowing a high density integration. Further, the secondary reservoir, the aluminum film 24 is provided within the contact hole. This means that providing the secondary reservoir results in no increase in the necessary area thereby allowing a high density integration.

Both the reservoir and secondary reservoir supply aluminum atoms to the end portion of the aluminum film of the interconnection layer. When electron currents flow from the contact layer to the aluminum film of the interconnection layer, then any void is likely to be formed due to electromigration in the aluminum film near a boundary between the aluminum film and the tungsten plug or the titanium nitride film since aluminum has a smaller electromigration resistance than that of tungsten or titanium nitride. If, however, any void is about to be formed due to electromigration, then immediately aluminum atoms in the reservoir portion move or migrate toward the position at which a void is about to be formed. Whilst aluminum atoms migrate from the boundary region along the electron current, a sufficient amount of fresh aluminum atoms are supplied from the reservoir portion to the boundary portion, to the tungsten film, of the aluminum film. For this reason, almost no void is formed due to electromigration. Accordingly, providing the reservoir portion near the boundary between the aluminum film and the tungsten plug or titanium nitride can prevent any formation of a void due to electromigration for the above reason. Further, the reservoir portion is provided so that no part of the reservoir portion extends outwardly from the interconnection layers in horizontal directions. Needless to say, this structural condition is very important for realizing a possible high density integration in the two dimensional direction of the semiconductor device including multilevel interconnections. Therefore, the reservoir portion with the secondary reservoir portion of the present intention provides two very important effects, or not only prevents any formation of void due to electromigration, but also allows a possible high density integration in the two dimensional direction.

Figure 11:
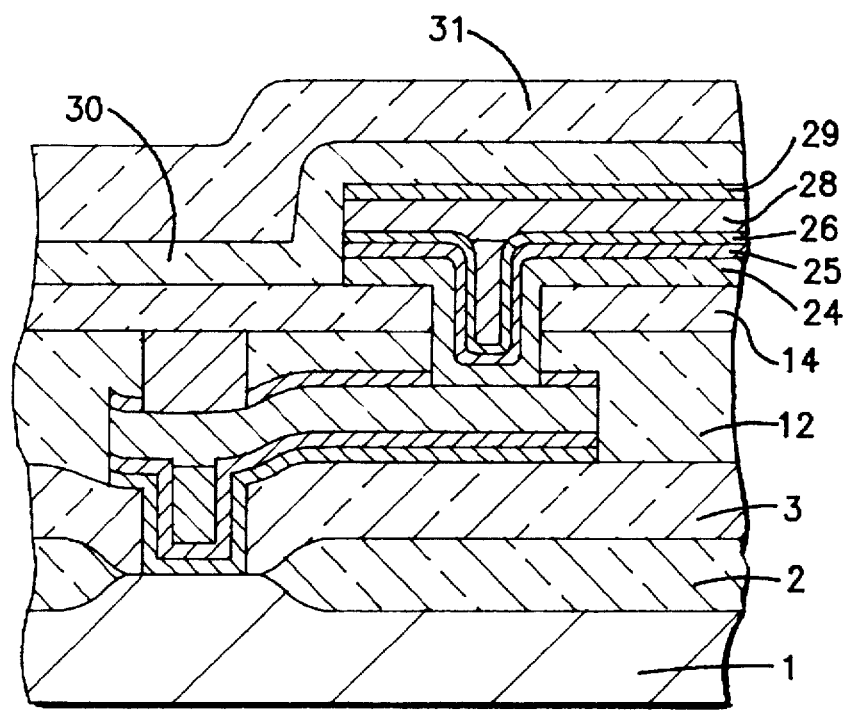
FIG. 11 is a fragmentary cross sectional elevation view illustrative of novel structure is a fragmentary cross sectional elevation view illustrative of novel structure of multilevel interconnections and a contact hole in a seventh embodiment according to the present invention.

A seventh embodiment according to the present invention will be described with reference to FIG. 11, wherein a novel structure of multilevel interconnection layers extending within inter-layer insulators and being connected to each other through a contact layer. The novel multilevel interconnection layers are structurally and physically improved not only to allow a high density integration of the interconnection layers but also to prevent any void formation due to electromigration of aluminum atoms in the interconnection layers The structure of the novel multilevel interconnection layers is illustrated in FIG. 11 from which the interconnections structurally differs from that of the second embodiment in view of providing no second reservoir portion. Any other structural points are the same as those of the second embodiment.

As described above, no second reservoir portion and the secondary reservoir portion, namely the aluminum film 24 is provided within the contact hole. This means that providing no second reservoir portion results in reduction in the necessary area thereby improving a high density integration.

The secondary reservoir alone can supply aluminum atoms to the and portion of the aluminum film of the interconnection layer. When electron currents flow from the contact layer to the aluminum film of the interconnection layer, then any void is likely to be formed due to electromigration in the aluminum film near a boundary between the aluminum film and the tungsten plug or the titanium nitride film since aluminum has a smaller electromigration resistance than that of tungsten or titanium nitride. If, however, any void is about to be formed due to electromigration, then immediately aluminum atoms in the secondary reservoir portion move or migrate toward the position at which a void is about to be formed. Whilst aluminum atoms migrate from the boundary region along the electron current, a sufficient amount of fresh aluminum atoms are supplied from the reservoir portion to the boundary portion, to the tungsten film, of the aluminum film. For this reason, almost no void is formed due to electromigration. Accordingly, providing the secondary reservoir portion near the boundary between the aluminum film and the tungsten plug or titanium nitride can prevent any formation of void due to electromigration for the above reason. Further, the secondary reservoir portion is provided so that no part of the reservoir portion extends outwardly from the interconnection layers in horizontal directions. Needless to say, this structural condition is very important for realizing a possible high density integration in the two dimensional direction of the semiconductor device including multilevel interconnections. Therefore, the reservoir portion with the secondary reservoir portion of the present invention provides two very important effects, or not only prevents any formation of void due to electromigration, but also allows a possible high density integration in the two dimensional direction.

An eighth embodiment according to the present invention will be described with reference to FIG. 12, wherein a novel structure of multilevel interconnection layers extending within inter-layer insulators and being connected to each other through a contact layer. The novel multilevel interconnection layers are structurally and physically improved not only to allow a high density integration of the interconnection layers but also to prevent any void formation due to electromigration of aluminum atoms in the interconnection layers.

Figure 12:
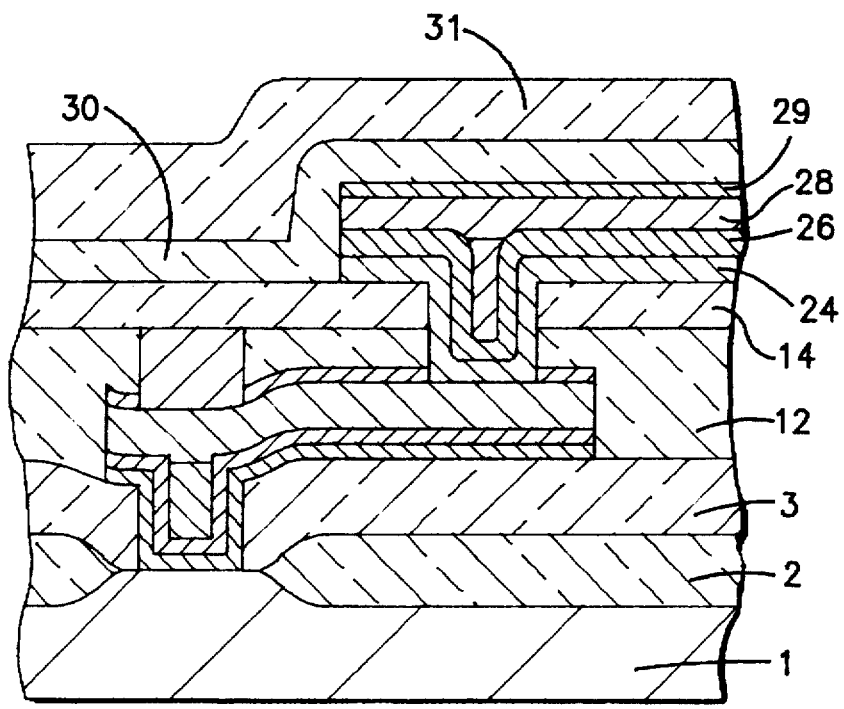
FIG. 12 is a fragmentary cross sectional elevation view illustrative of novel structure of multilevel interconnections and a contact hole in an eighth embodiment according to the present invention.

The structure of the novel multilevel interconnection layers is illustrated in FIG 12 from which the interconnections structurally differs from that of the second embodiment in view of providing no titanium film within the second contact hole. Any other structural points are the same as those of the second embodiment.

The effect of this embodiments are substantially the same as those of the seventh embodiment.

A ninth embodiment according to the present invention will be described with reference to FIG. 13, wherein a novel structure of multilevel interconnection layers extending within inter-layer insulators and being connected to each other through a contact layer. The novel multilevel interconnection layers are structurally and physically improved not only to allow a high density integration of the interconnection layers but also to prevent any void formation due to electromigration of aluminum atoms in the interconnection layers.

Figure 13:
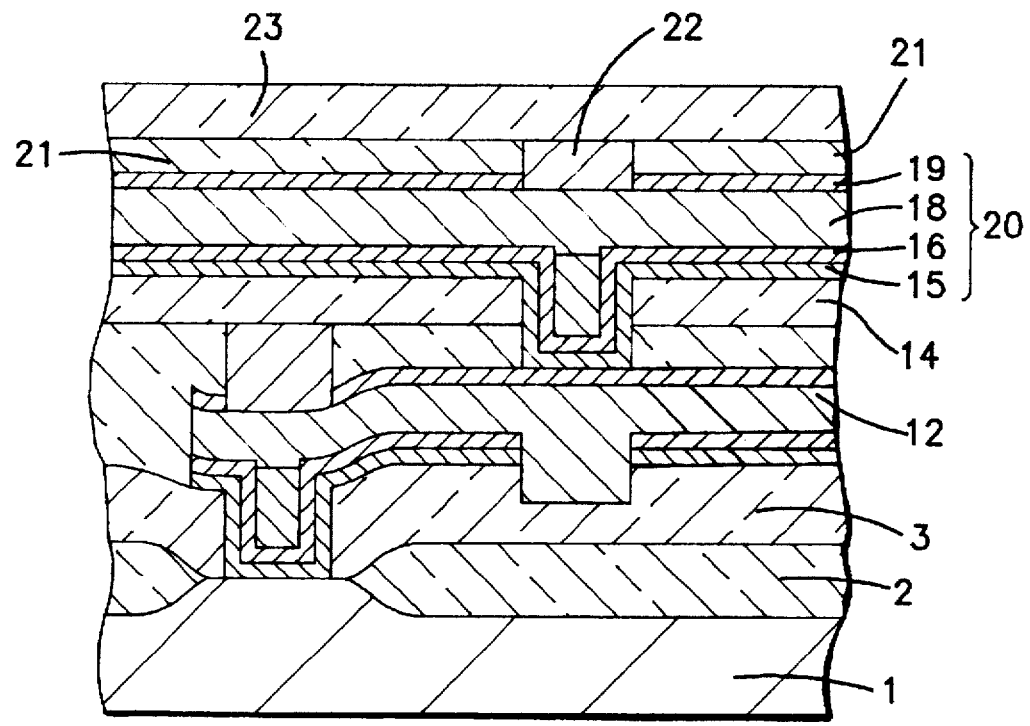
FIG. 13 is a fragmentary cross sectional elevation view illustrative of novel structure of multilevel interconnections and a contact hole in a ninth embodiment according to the present invention.

The structure of the novel multilevel interconnection layers is illustrated in FIG. 13 from which the interconnections structurally differs from that of the first embodiment in view of connecting the interconnection layer to the contact hole at its intermediate portion except for the end portion. Both side portions of the interconnection layer serve as interconnections but not reservoir. Any other structural points are the same as those of the second embodiment.

The effect of this embodiments are substantially the same as those of the first embodiment.

A tenth embodiment according to the present invention will be described with reference to FIG. 14, wherein a novel structure of multilevel interconnection layers extending within inter-layer insulators and being connected to each other through a contact layer. The novel multilevel interconnection layers are structurally and physically improved not only to allow a high density integration of the interconnection layers but also to prevent any void formation due to electromigration of aluminum atoms in the interconnection layers.

Figure 14:
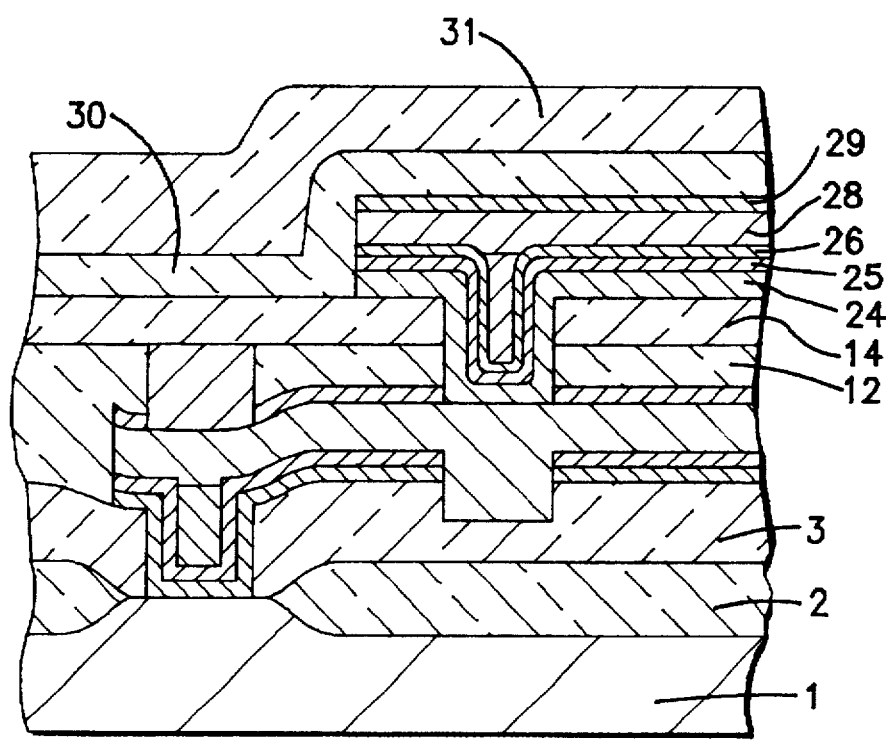
FIG. 14 is a fragmentary cross sectional elevation view illustrative of novel structure of multilevel interconnections and a contact hole in a tenth embodiment according to the present invention.

The structure of the novel multilevel interconnection layers is illustrated in FIG. 14 from which the interconnections structurally differs from that of the second embodiment in view of connecting the interconnection layer to the contact hole at its intermediate portion except for the end portion. Both side portions of the interconnection layer serve as interconnections but not reservoir. Any other structural points are the same as those of the second embodiment.

The effect of this embodiments are substantially the same as those of the second embodiment.

An eleventh embodiment according to the present invention will be described with reference to FIG. 15, wherein a novel structure of multilevel interconnection layers extending within inter-layer insulators and being connected to each other through a contact layer. The novel multilevel interconnection layers are structurally and physically improved not only to allow a high density integration of the interconnection layers but also to prevent any void formation due to electromigration of aluminum atoms in the interconnection layers.

Figure 15:
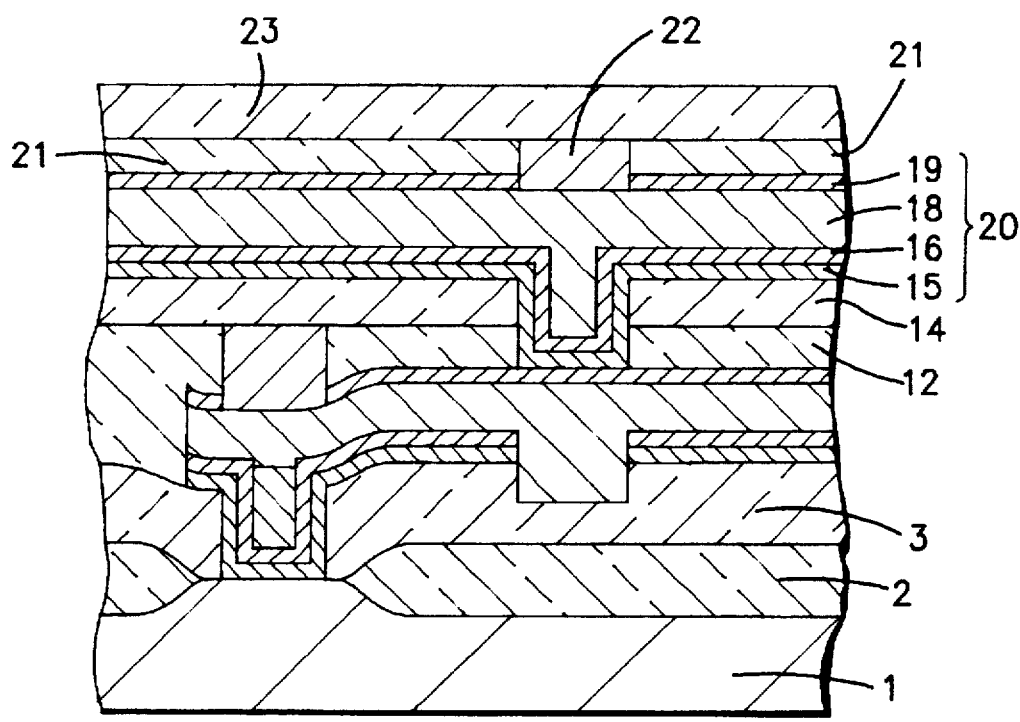
FIG. 15 is a fragmentary cross sectional elevation view illustrative of novel structure of multilevel interconnections and a contact hole in an eleventh embodiment according to the present invention.

The structure of the novel multilevel interconnection layers is illustrated in FIG. 15 from which the interconnections structurally differs from that of the third embodiment in view of connecting the interconnection layer to the contact hole at its intermediate portion except for the end portion. Both side portions of the interconnection layer serve as interconnections but not reservoir. Any other structural points are the same as those of the third embodiment.

The effect of this embodiments are substantially the same as those of the third embodiment A twelfth embodiment according to the present invention will be described with reference to FIG. 16, wherein a novel structure of multilevel interconnection layers extending within inter-layer insulators and being connected to each other through a contact layer. The novel multilevel interconnection layers are structurally and physically improved not only to allow a high density integration of the interconnection layers but also to prevent any void formation due to electromigration of aluminum atoms in the interconnection layers.

Figure 16:
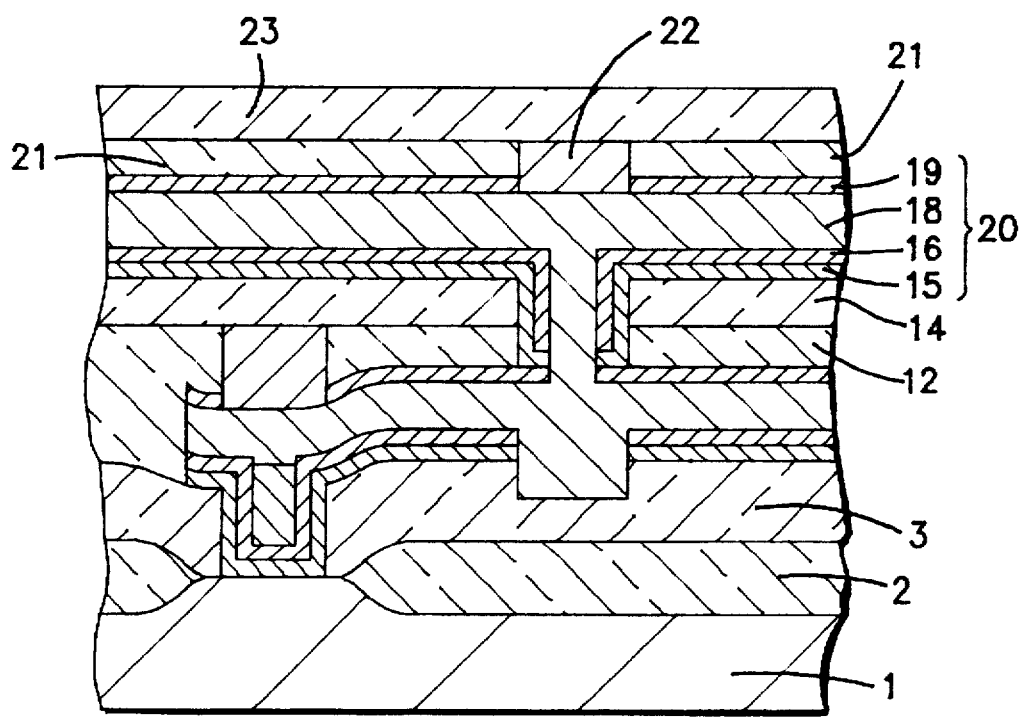
FIG. 16 is a fragmentary cross sectional elevation view illustrative of novel structure of multilevel interconnections and a contact hole in a twelfth embodiment according to the present invention.

The structure of the novel multilevel interconnection layers is illustrated in FIG. 16 from which the interconnections structurally differs from that of the fourth embodiment in view of connecting the interconnection layer to the contact hole at its intermediate portion except for the end portion. Both side portions of the interconnection layer serve as interconnections but not reservoir. Any other structural points are the same as those of the fourth embodiment.

The effect of this embodiments are substantially the same as those of the fourth embodiment.

A thirteenth embodiment according to the present invention will be described with reference to FIG. 17, wherein a novel structure of multilevel interconnection layers extending within inter-layer insulators and being connected to each other through a contact layer. The novel multilevel interconnection layers are structurally and physically improved not only to allow a high density integration of the interconnection layers but also to prevent any void formation due to electromigration of aluminum atoms in the interconnection layers.

Figure 17:
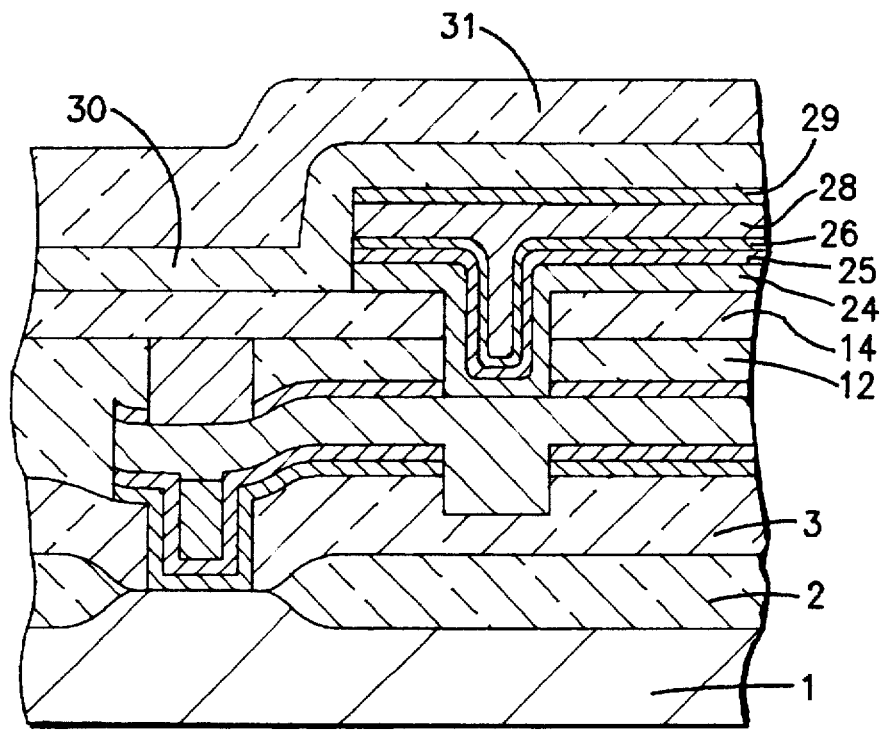
FIG. 17 is a fragmentary cross sectional elevation view illustrative of novel structure of multilevel interconnections and a contact hole in a thirteenth embodiment according to the present invention.

The structure of the novel multilevel interconnection layers is illustrated in FIG. 17 from which the interconnections structurally differs from that of the sixth embodiment in view of connecting the interconnection layer to the contact hole at its intermediate portion except for the end portion. Both side portions of the interconnection layer serve as interconnections but not reservoir. Any other structural points are the same as those of the sixth embodiment.

The effect of this embodiments are substantially the same as those of the sixth embodiment.

A fourteenth embodiment according to the present invention will be described with reference to FIG. 18, wherein a novel structure of multilevel interconnection layers extending within inter-layer insulators and being connected to each other through a contact layer. The novel multilevel interconnection layers are structurally and physically improved not only to allow a high density integration of the interconnection layers but also to prevent any void formation due to electromigration of aluminum atoms in the interconnection layers.

Figure 18:
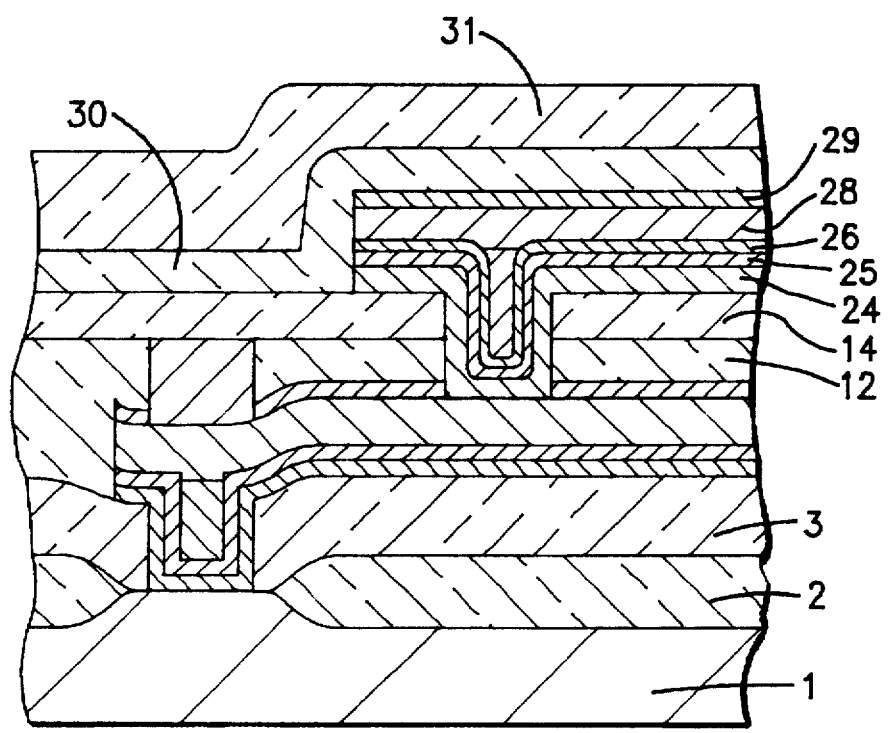
FIG. 18 is a fragmentary cross sectional elevation view illustrative of novel structure of multilevel interconnections and a contact hole in a fourteenth embodiment according to the present invention.

The structure of the novel multilevel interconnection layers is illustrated in FIG. 18 from which the interconnections structurally differs from that of the seventh embodiment in view of connecting the interconnection layer to the contact hole at its intermediate portion except for the end portion. Both side portions of the interconnection layer serve as interconnections but not reservoir. Any other structural points are the same as those of the seventh embodiment.

The effect of this embodiments are substantially the same as those of the seventh embodiment.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the invention.

What is claimed is:

1. An interconnection structure comprising:
   an insulation layer having a contact hole which extends in a first vertical direction;
   a contact layer residing within said contact hole, said contact layer being made of a first conductive material which has a first electromigration resistance, and
   an interconnection layer extending within said insulation layer, said interconnection layer having one end portion which is in contact with one end of said contact layer, said interconnection layer being made of a second conductive material having a second electromigration resistance which is smaller than said first electromigration resistance, said interconnection layer having a reservoir portion which is made of said second conductive material,
   wherein said reservoir portion extends within said insulation layer and extends from said one end portion of said interconnection insulator in a second vertical direction which is opposite to said first vertical direction.

2. The interconnection structure as claimed in claim 1, wherein said first vertical direction is upward and said second vertical direction is downward.

3. The interconnection structure as claimed in claim 1, wherein said first vertical direction is downward and said second vertical direction is upward.

4. The interconnection structure as claimed in claim 1, wherein said first conductive material is a refractory metal.

5. The interconnection structure as claimed in claim 4, wherein said refractory metal is one selected from the group consisting of tungsten and titanium.

6. The interconnection structure as claimed in claim 1, wherein said first conductive material is titanium nitride.

7. The interconnection structure as claimed in claim 1, wherein said first conductive material is a refractory silicide.

8. The interconnection structure as claimed in claim 1, wherein said second conductive material is a non-refractory metal which is not classified into refractory metals.

9. The interconnection structure as claimed in claim 8, wherein said metal is one selected from the group consisting of Al, Cu and AlSiCu.

10. The interconnection structure as claimed in claim 9, further comprising a titanium nitride film which coats an entire surface of said interconnection layer except for said reservoir portion, provided that said insulation layer is made of silicon oxide, to physically isolate said non-refractory metal from said insulation layer made of silicon oxide.

11. The interconnection structure as claimed in claim 10, further comprising a titanium film which is interposed between said titanium nitride film and said insulation layer made of silicon oxide.

12. The interconnection structure as claimed in claim 1, wherein said interconnection layer extends in a horizontal direction so that said interconnection layer and said contact layer are connected with each other at a right angle.

13. The interconnection structure as claimed in claim 1, wherein said contact layer comprises:
- a titanium film extending at least on a vertical inner wall of said contact hole;
- a titanium nitride film extending on said titanium film; and
- a tungsten film residing on said titanium nitride film so that laminations of said titanium film, said titanium nitride film and said tungsten film fill up all entire part of said contact hole.

14. The interconnection structure as claimed in claim 13, wherein said titanium film further extends on a horizontal inner wall of said contact hole.

15. The interconnection structure as claimed in claim 1, wherein said reservoir portion has a horizontal section area which is nearly equal to a vertical section area of said interconnection layer.

16. The interconnection structure as claimed in claim 1, wherein said reservoir portion has a vertical length which is substantially equal to or larger than a thickness of said interconnection layer.

17. The interconnection structure as claimed in claim 1, further comprising an additional interconnection layer extending within said insulation layer, said additional interconnection layer having one end portion which is in contact with another end, which is opposite to said one end, of said contact layer, and said additional interconnection layer being made of said second conductive material.

18. The interconnection structure as claimed in claim 17, wherein said additional interconnection layer has an additional reservoir portion which is made of the same material as said additional interconnection layer, and said additional reservoir portion extends within said insulation layer and further extends from said one end portion of said additional interconnection layer in said first vertical direction.

19. The interconnection structure as claimed in claim 17, wherein said additional interconnection layer has substantially the same structure as said interconnection layer.

20. The interconnection structure as claimed in claim 18, wherein said additional reservoir portion has substantially the same size as said reservoir portion.

21. An interconnection structure comprising:
- an insulation layer having a contact hole which extends in a first vertical direction;
- a contact layer residing within said contact hole, said contact layer being made of a first conductive material which has a first electromigration resistance; and
- an interconnection layer extending within said insulation layer, said interconnection layer having an intermediate portion which is in contact with one end of said contact layer so that an electron current is divided at said intermediate portion into two currents flowing on said interconnection layer in opposite directions, said interconnection layer being made of a second conductive material having a second electromigration resistance which is smaller than said first electromigration resistance, said interconnection layer having a reservoir portion which is made of said second conductive material,
- wherein said reservoir portion extends within said insulation layer and extends from said intermediate portion in a second vertical direction which is opposite to said first vertical direction.

22. The interconnection structure as claimed in claim 21, wherein said first vertical direction is upward and said second vertical direction is downward.

23. The interconnection structure as claimed in claim 21, wherein said first vertical direction is downward and said second vertical direction is upward.

24. The interconnection structure as claimed in claim 21, wherein said first conductive material is a refractory metal.

25. The interconnection structure as claimed in claim 24, wherein said refractory metal is one selected from the group consisting of tungsten and titanium.

26. The interconnection structure as claimed in claim 21, wherein said first conductive material is titanium nitride.

27. The interconnection structure as claimed in claim 21, wherein said first conductive material is a refractory silicide.

28. The interconnection structure as claimed in claim 21, wherein said second conductive material is a non-refractory metal which is not classified into refractory metals.

29. The interconnection structure as claimed in claim 28, wherein said metal is one selected from the group consisting of Al, Cu and AlSiCu.

30. The interconnection structure as claimed in claim 29, further comprising a titanium nitride film which coats an entire surface of said interconnection layer except for said reservoir portion, provided that said insulation layer is made of silicon oxide, to physically isolate said non-refractory metal from said insulation layer made of silicon oxide.

31. The interconnection structure as claimed in claim 30, further comprising a titanium film which is interposed between said titanium nitride film and said insulation layer made of silicon oxide.

32. The interconnection structure as claimed in claim 21, wherein said interconnection layer extends in a horizontal direction so that said interconnection layer and said contact layer are connected with each other at a right angle.

33. The interconnection structure as claimed in claim 21, wherein said contact layer comprises;
- a titanium film extending at least on a vertical inner wall of said contact hole;
- a titanium nitride film extending on said titanium film; and
- a tungsten film residing on said titanium nitride film so that laminations of said titanium film, said titanium nitride film and said tungsten film fill up an entire part of said contact hole.

34. The interconnection structure as claimed in claim 33, wherein said titanium film further extends on a horizontal inner wall of said contact hole.

35. The interconnection structure as claimed in claim 21, wherein said reservoir portion has a horizontal section area which is nearly equal to a vertical section area of said interconnection layer.

36. The interconnection structure as claimed in claim 21, wherein said reservoir portion has a vertical length which is substantially equal to or larger than a thickness of said interconnection layer.

37. The interconnection structure as claimed in claim 21, further comprising an additional interconnection layer extending within said insulation layer, said additional interconnection layer having an intermediate portion which is in contact with another end, which is opposite to said one end, of said contact layer, and said additional interconnection layer being made of said second conductive material.

38. The interconnection structure as claimed in claim 37, wherein said additional interconnection layer has an additional reservoir portion which is made of the same material as said additional interconnection layer, and said additional reservoir portion extends within said insulation layer and further extends from said intermediate portion of said additional interconnection layer in said first vertical direction.

39. The interconnection structure as claimed in claim 37, wherein said additional interconnection layer has substantially the same structure as said interconnection layer.

40. The interconnection structure as claimed in claim 38, wherein said additional reservoir portion has substantially the same size as said reservoir portion.

41. An interconnection structure comprising:

an insulation layer having a contact hole which extends in a first vertical direction;

contact layer residing with said contact hole, said contact layer being made of a conductive material; and an interconnection layer being made of the same conductive material as said contact layer, said interconnection layer extending within said insulation layer in a horizontal direction, said interconnection layer having one end portion which is in contact with one end of said contact layer so that an electron current flows on both said contact layer and said interconnection layer, said electron current having a passage which is turned at an almost right angle at a boundary between said contact layer and said interconnection layer, said electron current having a higher current density at said boundary than other portions of both said interconnection layer and said contact layer, said interconnection layer having a reservoir portion within is made of the same material as said interconnection layer, wherein said reservoir portion extends within said insulation layer and extends from said end portion of said interconnection layer in a second vertical direction which is opposite to said first vertical direction.

42. The interconnection structure as claimed in claim 41, wherein said first vertical direction is upward and said second vertical direction is downward.

43. The interconnection stricture as claimed in claim 41 wherein said first vertical direction is downward and said second vertical direction is upward.

44. The interconnection stricture as claimed in claim 41, wherein said conductive material is a non-refractory metal which is not classified into refractory metals.

45. The interconnection structure as claimed in claim 44, wherein said non-refractory metal is one selected from the group consisting of Al, Cu and AlSiCu.

46. The interconnection structure as claimed in claim 45, further comprising a titanium nitride film which coats an entire surface of said interconnection layer except for said reservoir portion, provided that said insulation layer is made of silicon oxide, to physically isolate said non-refractory metal from said insulation layer made of silicon oxide.

47. The interconnection structure as claimed in claim 46, further comprising a titanium film which is interposed between said titanium nitride film and said insulation layer made of silicon oxide.

48. The interconnection structure as claimed in claim 44, wherein said contact layer comprises:

a titanium thin film extending at least on a vertical inner wall of said contact bole;

a titanium nitride thin film extending on said titanium film; and a non-refractory metal thick film being made of the same material as said interconnection layer, said non-refractory metal thick film residing on said titanium nitride film so that laminations of said titanium film, said titanium nitride film and said non-refractory metal thick film fill up an entire part of said contact hole.

49. The interconnection structure as claimed in claim 48, wherein said titanium film further extends on a horizontal inner wall of said contact hole.

50. The interconnection structure as claimed in claim 44, wherein said contact layer comprises:

a refractory metal thin film being made of a refractory metal, said refractory thin film extending at least on a vertical inner wall of said contact hole; and a non-refractory metal thick film being made of the same material as said interconnection layer, said non-refractory metal thick film residing on said refractory metal thin film so that laminations of said refractory metal thin film and said non-refractory metal thick film fill tip an entire part of said contact hole.

51. The interconnection structure as claimed in claim 50, wherein said refractory metal is one selected from the group consisting of tungsten and titanium.

52. The interconnection structure as claimed in claim 44, wherein said contact layer comprises:

a refractory suicide thin film being made of a refractory silicide, said refractory silicide thin film extending at least on a vertical inner wall of said contact hole; and a non-refractory metal thick film being made of the same material as said interconnection layer, said non-refractory metal thick film residing on said refractory thin film so that laminations of said refractory silicide thin film and said non-refractory metal thick film fill up an entire part of said contact hole.

53. The interconnection structure as claimed in claim 52, wherein said refractory silicide is one selected from the group consisting of tungsten suicide and molybdenum silicide.

54. The interconnection structure as claimed in claim 41, wherein said contact hole has a section area which is sufficiently smaller than an section area of said interconnection layer for further raising said current density at said boundary between said contact layer and said interconnection layer.

55. The interconnection structure as claimed in claim 41, wherein said reservoir portion has a horizontal section area which is nearly equal to a vertical section area of said interconnection layer.

56. The interconnection structure as claimed in claim 41, wherein said reservoir portion has a vertical length which is substantially equal to or larger than a thickness of said interconnection layer.

57. The interconnection structure as claimed in claim 41, further comprising an additional interconnection layer extending within said insulation layer, said additional interconnection layer having one end portion which is in contact with another end, which is opposite to said one end, of said contact layer, and said additional interconnection layer being made of said conductive material.

58. The interconnection structure as claimed in claim 57, wherein said additional interconnection layer has an additional reservoir portion which is made of the same material as said additional interconnection layer, and said additional reservoir portion extends within said insulation layer and further extends from said one end portion of said additional interconnection layer in said first vertical direction.

59. The interconnection structure as claimed in claim 57, wherein said additional interconnection layer has substantially the same structure as said interconnection layer.

60. The interconnection structure as claimed in claim 58, wherein said additional reservoir portion has substantially the same size as said reservoir portion.

61. An interconnection structure comprising:

an insulation layer having a contact hole which extends in a first vertical direction;

a contact layer residing within said contact hole, said contact layer being made of a conductive material; and an interconnection layer being made of the same conductive material as said contact layer, said interconnection layer extending within said insulation layer in a horizontal direction, said interconnection layer having an intermediate portion which is in contact with one end of said contact layer so that an electron current flows on both said contact layer and said interconnection layer, said electron current on said interconnection layer comprising two currents flowing in opposite directions, said electron current having a passage which is turned at all almost right angle at a boundary between said contact layer and said interconnection layer, said electron current having a higher current density at said boundary than other portions of both said interconnection layer and said contact layer, said interconnection layer having a reservoir portion which is made of the same material as said interconnection layer, wherein said reservoir portion extends within said insulation layer and extends from said intermediate portion in a second vertical direction which is opposite to said first vertical direction.

62. The interconnection structure as claimed in claim 61, wherein said first vertical direction is upward and said second vertical direction is downward.

63. The interconnection structure as claimed in claim 61, wherein said first vertical direction is downward and said second vertical direction is upward.

64. The interconnection structure as claimed in claim 61, wherein said conductive material is a non-refractory metal which is not classified into refractory metals.

65. The interconnection structure as claimed in claim 64, wherein said non-refractory metal is one selected from the group consisting of Al, Cu and AlSiCu.

66. The interconnection structure as claimed in claim 65, further comprising a titanium nitride film which coats an entire surface of said interconnection layer except for said reservoir portion, provided that said insulation layer is made of silicon oxide, to physically isolate said non-refractory metal from said insulation layer made of silicon oxide.

67. The interconnection structure as claimed in claim 66, further comprising a titanium film which is interposed between said titanium nitride film and said insulation layer made of silicon oxide.

68. The interconnection structure as claimed in claim 64, wherein said contact layer comprises:

a titanium thin film extending at least on a vertical inner wall of said contact hole;

a titanium nitride thin film extending on said titanium film; and a non-refractory metal thick film being made of the same material as said interconnection layer, said non-refractory metal thick film residing on said titanium nitride film so that laminations of said titanium film, said titanium nitride film and said non-refractory metal thick film fill up an entire part of said contact hole.

69. The interconnection structure as claimed in claim 68, wherein said titanium film further extends on a horizontal inner wall of said contact hole.

70. The interconnection structure as claimed in claim 64, wherein said contact layer comprises:

a refractory metal thin film being made of a refractory metal, said refractory thin film extending at least on a vertical inner wall of said contact hole; and a non-refractory metal thick film being made of the same material as said interconnection layer, said non-refractory metal thick film residing on said refractory metal thick film so that laminations of said refractory metal thin film and said non-refractory metal thick film fill up an entire part of said contact hole.

71. The interconnection structure as claimed in claim 70, wherein said refractory metal is one selected from the group consisting of tungsten and titanium.

72. The interconnection structure as claimed in claim 64, wherein said contact layer comprises:

a refractory silicide thin film being made of a refractory silicide, said refractory silicide thin film extending at least on a vertical inner wall of said contact hole; and a non-refractory metal thick film being made of the same material as said interconnection layer, said non-refractory metal thick film residing on said refractory thin film so that laminations of said refractory silicide thin film and said non-refractory metal thick film fill up an entire part of said contact hole.

73. The interconnection structure as claimed in claim 72, wherein said refractory silicide is one selected from the group consisting of tungsten silicide and molybdenum silicide.

74. The interconnection structure as claimed in claim 61, wherein said contact hole has a section area which is sufficiently smaller than an section area of said interconnection layer for fiber raising said current density at said boundary between said contact layer and said interconnection layer.

75. The interconnection structure as claimed in claim 61, wherein said reservoir portion has a horizontal section area which is nearly equal to a vertical section area of said interconnection layer.

76. The interconnection structure as claimed in claim 61, wherein said reservoir portion bas a vertical length which is substantially equal to or larger than a thickness of said interconnection layer.

77. The interconnection structure as claimed in claim 61, further comprising an additional interconnection layer extending within said insulation layer, said additional interconnection layer having an intermediate portion which is in contact with another end, which is opposite to said one end, of said contact layer, and said additional interconnection layer being made of said conductive material.

78. The interconnection structure as claimed in claim 77, wherein said additional interconnection layer has an additional reservoir portion which is made of the same material as said additional interconnection layer, and said additional reservoir portion extends within said insulation layer and further extends from said intermediate portion of said additional interconnection layer in said first vertical direction.

79. The interconnection structure as claimed in claim 77, wherein said additional interconnection layer has substantially the same structure as said interconnection layer.

80. The interconnection structure as claimed in claim 78, wherein said additional reservoir portion has substantially the same size as said reservoir portion.

81. An interconnection structure comprising:

an insulation layer having a contact hole which extends in a first vertical direction;

a contact layer being provided within said contact hole to fill up said contact hole, said contact layer comprising:

a first contact film both extending on a vertical inner wall of said contact hole and filling one end of said contact hole, said first contact film being made of a first conductive material having a first electromigration resistance, a second contact film extending on said first contact film, said second contact film being made of a second conductive material having a second electromigration resistance which is higher than said first electromigration resistance, and a third contact film extending on said second contact film so that laminations of said first, second and third contact films fill up an entire part of said contact hole, said third contact film being made of a third conductive material having a third electromigration resistance which is substantially equal to or smaller than said second electromigration resistance; and an interconnection layer extending within said insulation layer, said interconnection layer having one end portion which is connected with said one end of said contact hole so that said interconnection layer is in contact with said first contact film, said interconnection layer being made of said first conductive material.

82. The interconnection structure as claimed in claim 81, wherein said first vertical direction is upward and said second vertical direction is downward.

83. The interconnection structure as claimed in claim 81, wherein said first vertical direction is downward and said second vertical direction is upward.

84. The interconnection structure as claimed in claim 81, wherein said first conductive material is a non-refractory metal which is not classified into refractory metals.

85. The interconnection structure as claimed in claim 84, wherein said non-refractory metal is one selected from the group consisting of Al, Cu and AlSiCu.

86. The interconnection structure as claimed in claim 81, wherein said second conductive material is a refractory metal.

87. The interconnection structure as claimed in claim 81, wherein said second conductive material is titanium nitride.

88. The interconnection structure as claimed in claim 81, wherein said second conductive film comprises laminations of a titanium film and a titanium nitride film.

89. The interconnection structure as claimed in claim 81, wherein said second conductive material is a refractory silicide.

90. The interconnection structure as claimed in claim 81, wherein said third conductive material is a refractory metal.

91. The interconnection structure as claimed in claim 81, wherein said third conductive material is the same as said first conductive material.

92. The interconnection structure as claimed in claim 81, wherein said interconnection layer has a reservoir portion which is made of the same material as said interconnection layer, and said reservoir portion extends within said insulation layer and extends from said one end portion of said interconnection layer in a second vertical direction which is opposite to said first vertical direction.

93. The interconnection structure as claimed in claim 92, wherein said reservoir portion has a horizontal section area which is nearly equal to a vertical section area of said interconnection layer.

94. The interconnection structure as claimed in claim 92, wherein said reservoir portion has a vertical length which is substantially equal to or larger than a thickness of said interconnection layer.

95. The interconnection structure as claimed in claim 84, further comprising a titanium nitride film which coats an entire surface of said interconnection layer, provided that said insulation layer is made of silicon oxide, to physically isolate said non-refractory metal from said insulation layer made of silicon oxide.

96. The interconnection structure as claimed in claim 95, further comprising a titanium film which is interposed between said titanium nitride film and said insulation layer made of silicon oxide.

97. The interconnection structure as claimed in claim 81, further comprising an additional interconnection layer extending within said insulation layer, said additional interconnection layer having one end portion which is in contact with another end, which is opposite to said one end, of said contact layer, and said additional interconnection layer being made of said first conductive material.

98. The interconnection structure as claimed in claim 97, wherein said additional interconnection layer has an additional reservoir portion which is made of the same material as said additional interconnection layer, and said additional reservoir portion extends within said insulation layer and further extends from said one end portion of said additional interconnection layer in said first vertical direction.

99. The interconnection structure as claimed in claim 97, wherein said additional interconnection layer has substantially the same structure as said interconnection layer.

100. The interconnection structure as claimed in claim 98, wherein said additional reservoir portion has substantially the same size as said reservoir portion.

101. An interconnection structure comprising:

an insulation layer having a contact hole which extends in a first vertical direction;

a contact layer being provided within said contact hole to fill up said contact hole, said contact layer comprising:

a first contact film both extending on a vertical inner wall of said contact hole and filling up one end of said contact hole, said first contact film being made of a first conductive material having a first electromigration resistance, a second contact film extending on said first contact film, said second contact film being made of a second conductive material having a second electromigration resistance which is higher than said first electromigration resistance, and a third contact film extending on said second contact film so that laminations of said first, second and third contact films fill up an entire part of said contact hole, said third contact film being made of a third conductive material having a third electromigration resistance which is substantially equal to or smaller than said second electromigration resistance; and an interconnection layer extending within said insulation layer, said interconnection layer having an intermediate portion which is connected with said contact layer so that said interconnection layer is in contact with said first contact film, wherein an electron current is divided at said intermediate portion into two currents flowing on said interconnection layer in opposite directions, said interconnection layer being made of said first conductive material.

102. The interconnection structure as claimed in claim 101, wherein said first vertical direction is upward and said second vertical direction is downward.

103. The interconnection structure as claimed in claim 101, wherein said first vertical direction is downward and said second vertical direction is upward.

104. The interconnection structure as claimed in claim 101, wherein said first conductive material is a non-refractory metal which is not classified into refractory metals.

105. The interconnection stricture as claimed in claim 104, wherein said non-refractory metal is one selected from the group consisting of Al, Cu and AlSiCu.

106. The interconnection structure as claimed in claim 101, wherein said second conductive material is a refractory metal.

107. The interconnection structure as claimed in claim 101, wherein said second conductive material is titanium nitride.

108. The interconnection structure as claimed in claim 101, wherein said second conductive film comprises laminations of a titanium film and a titanium nitride film.

109. The interconnection structure as claimed in claim 101, wherein said second conductive material is a refractory silicide.

110. The interconnection structure as claimed in claim 101, wherein said third conductive material is a refractory metal.

111. The interconnection structure as claimed in claim 101, wherein said third conductive material is the same as said first conductive material.

112. The interconnection structure as claimed in claim 101, wherein said interconnection layer having a reservoir portion which is made of the same material as said interconnection layer, and said reservoir portion extends within said insulation layer and extends from said one end portion of said interconnection layer in a second vertical direction which is opposite to said first vertical direction.

113. The interconnection structure as claimed in claim 112, wherein said reservoir portion has a horizontal section area which is nearly equal to a vertical section area of said interconnection layer.

114. The interconnection structure as claimed in claim 112, wherein said reservoir portion has a vertical length which is substantially equal to or larger than a thickness of said interconnection layer.

115. The interconnection structure as claimed in claim 104, further comprising a titanium nitride film which coats an entire surface of said interconnection layer, provided that said insulation layer is made of silicon oxide, to physically isolate said non-refractory metal from said insulation layer made of silicon oxide.

116. The interconnection structure as claimed in claim 115, further comprising a titanium film which is interposed between said titanium nitride film and said insulation layer made of silicon oxide.

117. The interconnection structure as claimed in claim 101, further comprising an additional interconnection layer extending within said insulation layer, said additional interconnection layer having one end portion which is in contact with another end, which is opposite to said one end, of said contact layer, and said additional interconnection layer being made of said first conductive material.

118. The interconnection structure as claimed in claim 117, wherein said additional interconnection layer has an additional reservoir portion which is made of the same material as said additional interconnection layer, and said additional reservoir portion extends within said insulation layer and further extends from said one end portion of said additional interconnection layer in said first vertical direction.

119. The interconnection structure as claimed in claim 117, wherein said additional interconnection layer has substantially the same structure as said interconnection layer.

120. The interconnection structure as claimed in claim 118, wherein said additional reservoir portion has substantially the same size as said reservoir portion.

* * * * *